(12) United States Patent
Minegishi et al.

(10) Patent No.: US 8,213,185 B2
(45) Date of Patent: Jul. 3, 2012

(54) INTERPOSER SUBSTRATE INCLUDING CAPACITOR FOR ADJUSTING PHASE OF SIGNAL TRANSMITTED IN SAME INTERPOSER SUBSTRATE

(75) Inventors: Akira Minegishi, Osaka (JP); Kazuhide Uriu, Osaka (JP); Toru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 240 days.

(21) Appl. No.: 12/746,596

(22) PCT Filed: Sep. 9, 2009

(86) PCT No.: PCT/JP2009/004455
§ 371 (c)(1), (2), (4) Date: Jun. 7, 2010

(87) PCT Pub. No.: WO2010/041376
PCT Pub. Date: Apr. 15, 2010

(65) Prior Publication Data
US 2010/0265684 A1    Oct. 21, 2010

(30) Foreign Application Priority Data
Oct. 8, 2008    (JP) .................................. 2008-261466

(51) Int. Cl.
*H05K 1/18* (2006.01)
*H05K 7/00* (2006.01)

(52) U.S. Cl. ........ 361/783; 361/760; 361/761; 361/763; 257/724

(58) Field of Classification Search .................. None
See application file for complete search history.

(56) References Cited

U.S. PATENT DOCUMENTS

| | | | | |
|---|---|---|---|---|
| 6,407,929 B1 * | 6/2002 | Hale et al. | ...................... | 361/763 |
| 6,800,936 B2 * | 10/2004 | Kosemura et al. | ............ | 257/748 |
| 6,889,155 B2 * | 5/2005 | Ogino et al. | .................. | 702/113 |
| 7,531,416 B2 * | 5/2009 | Amey et al. | .................... | 438/329 |
| 7,613,007 B2 * | 11/2009 | Amey et al. | .................... | 361/763 |
| 7,821,795 B2 * | 10/2010 | Sugaya et al. | ................ | 361/761 |
| 2005/0230823 A1 | 10/2005 | Ohsaka | | |
| 2009/0284941 A1 * | 11/2009 | Oomori | ........................ | 361/761 |

FOREIGN PATENT DOCUMENTS

| | | |
|---|---|---|
| JP | 64-50450 | 2/1989 |
| JP | 2001-168236 | 6/2001 |
| JP | 2004-140295 | 5/2004 |
| JP | 2005-328032 | 11/2005 |
| JP | 2005-340676 | 12/2005 |

OTHER PUBLICATIONS

English translation of International Preliminary Report on Patentability and Written Opinion of the International Searching Authority, issued May 26, 2011 in PCT/JP2009/004455.
International Search Report issued Nov. 10, 2009 in International (PCT) Application No. PCT/JP2009/004455.

* cited by examiner

*Primary Examiner* — Boris Chervinsky
(74) *Attorney, Agent, or Firm* — Wenderoth, Lind & Ponack, L.L.P.

(57) ABSTRACT

In an interposer substrate, a plating stub conductor and a ground conductor form a capacitor, and a plating stub conductor and the ground conductor form a capacitor. Capacitances of the capacitors are adjusted so that a phase difference between signals transmitted by a differential transmission using a signal line including a connection wiring conductor and a signal line including a connection wiring conductor is equal to 180 degrees.

15 Claims, 20 Drawing Sheets

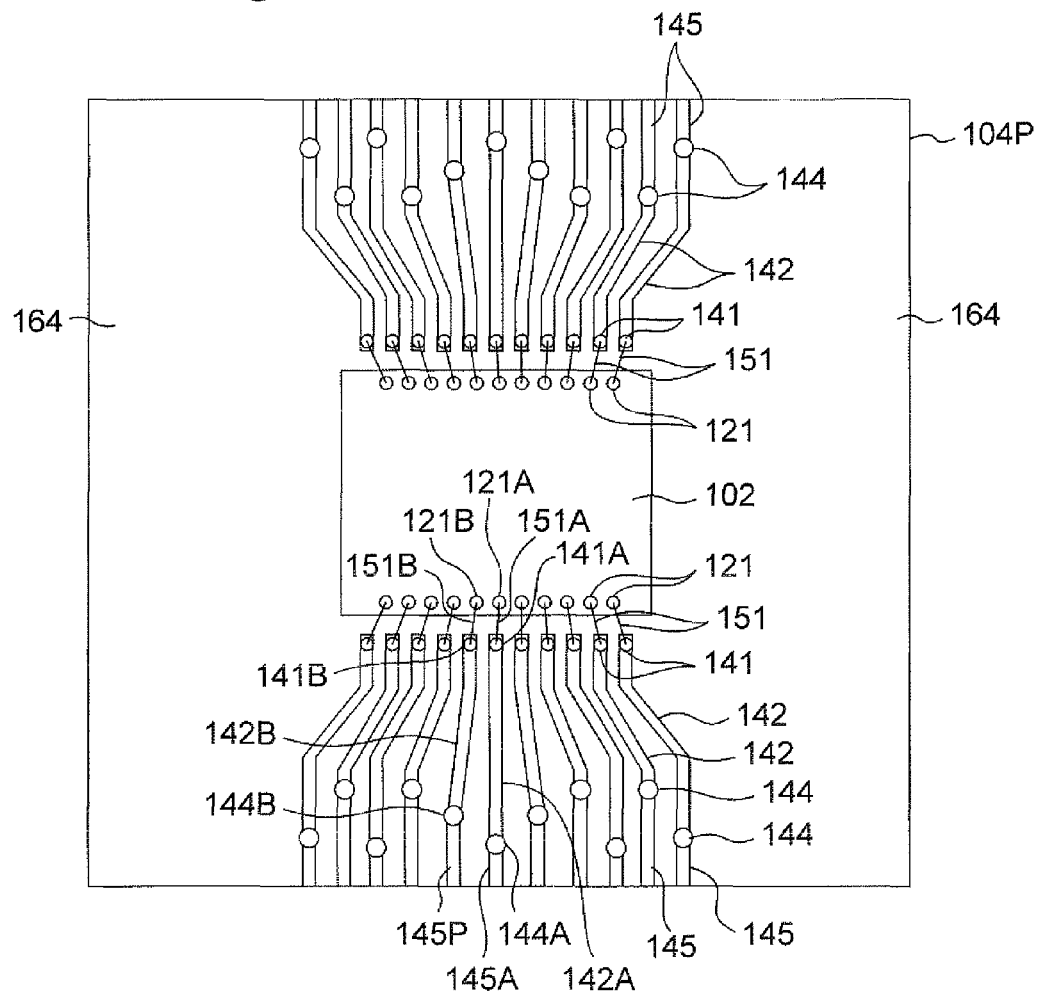
Fig. 19 - PRIOR ART

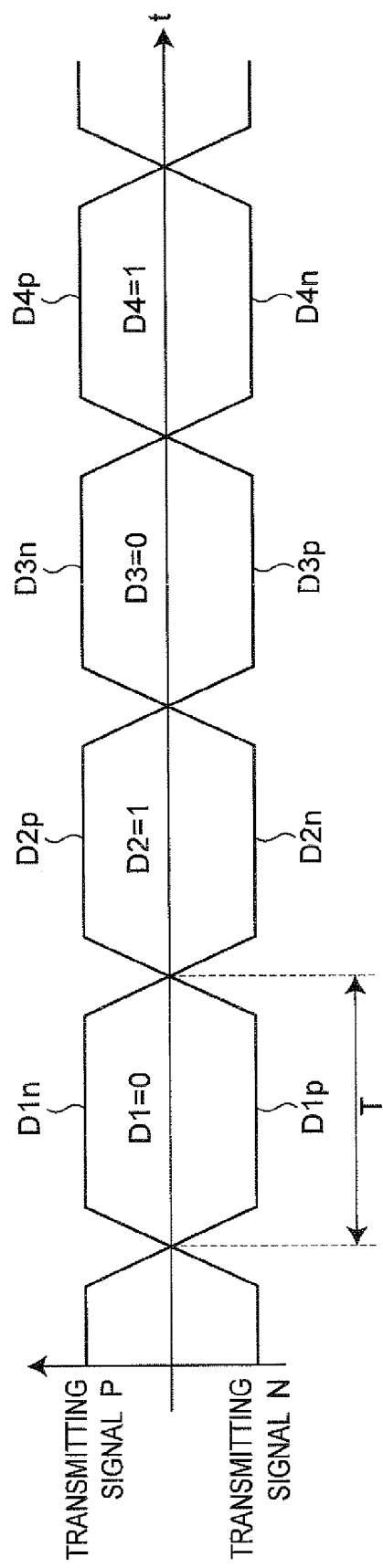
Fig.20 - PRIOR ART

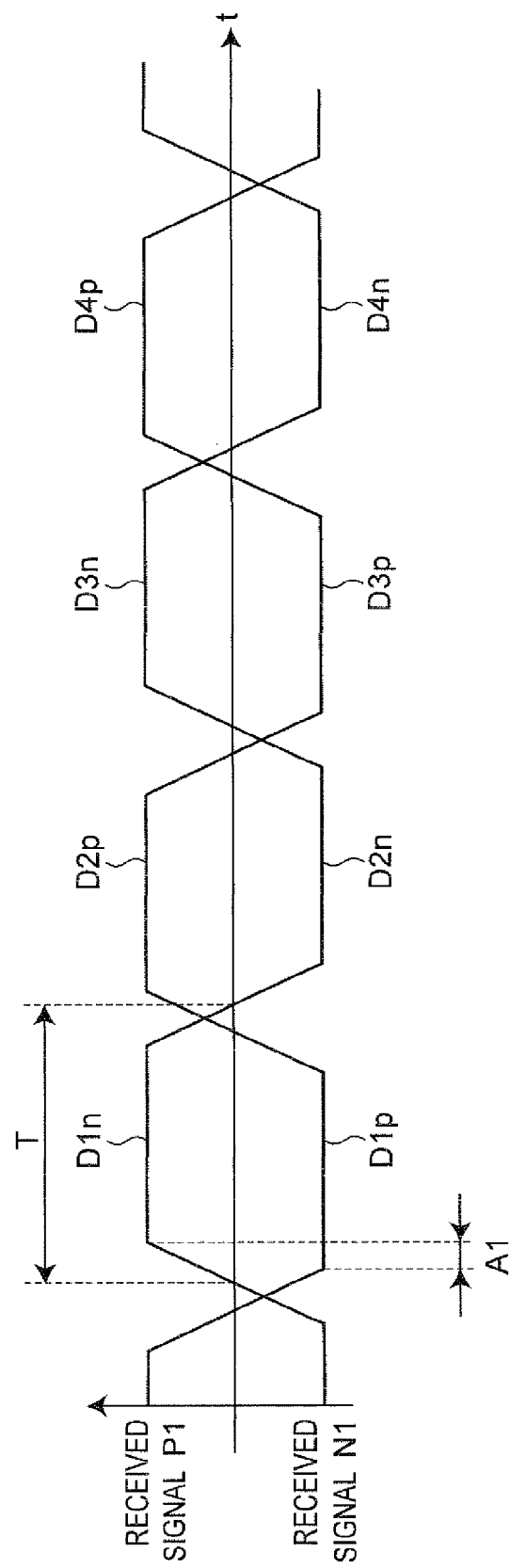
Fig. 21 - PRIOR ART

INTERPOSER SUBSTRATE INCLUDING CAPACITOR FOR ADJUSTING PHASE OF SIGNAL TRANSMITTED IN SAME INTERPOSER SUBSTRATE

TECHNICAL FIELD

The present invention relates to a semiconductor apparatus including an interposer substrate and a semiconductor device implemented on the interposer substrate, and an interposer substrate thereof.

BACKGROUND ART

Recently, a semiconductor apparatus has been accommodated in a multi-terminal package such as a BGA (Ball Grid Array) or a CSP (Chip Size Package). In such a semiconductor apparatus (generally speaking, also referred to as a semiconductor package), a semiconductor device is implemented on an interposer substrate (generally speaking, also referred to as an interposer), and the interposer substrate is implemented on a board such as a mother board.

FIG. 19 is a plan view of an interposer substrate 104P according to prior art, on which a semiconductor device 102 is implemented. Referring to FIG. 19, the semiconductor device 102 includes a plurality of terminals 121. A plurality of connection terminals (generally speaking, also referred to as input and output terminals or electrode pads) 141 are formed on a surface of the interposer substrate 104P. The terminals 121 of the semiconductor device 102 are electrically connected to the connection terminals 141 of the interposer substrate 104P, respectively, using wires 151. In FIG. 19, the terminals 121 are connected to the connection terminals 141 by wire bonding, however, the terminals 121 are often connected to the connection terminals 141, respectively, by bumps.

Further, on the surface of the interposer substrate 104P, connection wiring conductors 142 are formed. One end of the connection wiring conductor 142 is connected to one connection terminal 141, and another end of the connection wiring conductors 142 is connected to one end of one of via conductors 144 formed in the interposer substrate 104P. Another end of the via conductor 144 is electrically connected to a wiring formed on a back surface or inside of the interposer substrate 104P. Further, each of the wirings formed on the back surface or inside of the interposer substrate 104P is electrically connected to one of electrode pads formed on a mother board via a solder ball or the like.

In this case, generally speaking, the connection terminals 141 on the interposer substrate 104P is subjected to a noble metal plating (for example, a gold plating) treatment using electroplating. During this noble metal plating treatment, an electric current is applied to each of the connection terminals 141 via wirings formed on the interposer substrate 104P from an outer edge part of the interposer substrate 104P. After the application of the current, in each of the wirings, a part of the wiring used for the application of the current is used as the connection wiring conductor 142, which connects the connection terminal 141 to the via conductor 144. The remaining part of the wiring remains as the plating stub conductor 145 (generally speaking, also referred to as a plating line) extending from the via conductor 144 to the outer edge part of the interposer substrate 104P. Namely, one end of the plating stub conductors 145 is connected to one via conductor 144, and another end of the plating stub conductor 145 is an open end and forms an open end portion on the outer edge part of the interposer substrate 104P.

It has been known that the plating stub conductors 145 of the interposer substrate 104P have bad influence upon waveforms of transmitting signals transmitted via the connection wiring conductors 142. For example, Patent Document 1 points out such a problem that a waveform distortion occurs to an inputted signal inputted to a connection wiring conductor connected to a plating stub conductor, because of interference between the inputted signal and a reflected signal reflected by the open end of the plating stub conductor. In order to solve this problem, Patent Document 1 proposes eliminating remaining plating stub conductors. In addition, in order to solve a problem similar to above, Patent Document 2 proposes connecting the plating stub conductors to terminal resistors.

CITATION LIST

Patent Documents

Patent Document 1: Japanese patent laid-open publication No. JP-64-50450-A.
Patent Document 2: Japanese patent laid-open publication No. JP-2005-328032-A.

SUMMARY OF INVENTION

Technical Problem

Meanwhile, signals have been transmitted faster in electronic devices, and high-frequency signals having frequencies of gigahertz have been transmitted. On the other hand, an IC itself has been multi-functionalized, modularized, and densely implemented as represented by a system LSI (Large Scale Integration). In a semiconductor apparatus, which is implemented in high-density and deals with high-frequency signals, there is a possibility that problems completely different from the above problems pointed out in the above-mentioned Patent Documents 1 and 2 will occur.

The semiconductor device 102 has been miniaturized, and the number of terminals 121 thereof have been increased. Therefore, a plurality of terminals 121 has been formed on the semiconductor device 102 of FIG. 19 with a smaller pitch. The connection terminals 141 on the interposer substrate 104P are provided with a relatively small pitch so as to correspond to the terminals 121. In addition, the connection wiring conductors 142 are formed so that a spacing of the adjacent connection wiring conductors 142 becomes larger as distances from the connection terminals 141 become larger. In this case, generally speaking, an outside diameter of the via conductor 144 connected to another end of the connection wiring conductor 142 is larger than a width of the connection wiring conductor 142. Referring to FIG. 19, in order to miniaturize the substrate 104P, the via conductors 144 connected to the adjacent connection wiring conductors 142 are displaced from each other so as to have different distances from the outer edge part of the interposer substrate 104P.

In this way, because of the spatial constraints on the interposer substrate 104P and the like, the lengths of the connection wiring conductors 142 are different from each other, and electric resistances of the connection wiring conductors 142 are also different from each other. Therefore, the transmission times of a plurality of transmitting signals transmitted and received between the semiconductor device 102 and the mother board via the interposer substrate 104P are different from each other.

FIG. 20 is a timing chart showing a transmitting signal P outputted from a terminal 121A of the semiconductor device 102 of FIG. 19 and a transmitting signal N outputted from a terminal 121B. Referring to FIG. 20, each of the transmitting signals P and N have a time cycle T, and constitute a pair of differential signals. As shown in FIG. 20, in a differential transmission, data "1" or "0" is transmitted using an electric potential difference (P−N) between the transmitting signals P and N having a phase difference of 180 degrees. For example, in FIG. 20, when data D1 or D3 having a data value "0" is transmitted, the electric potential difference (P−N) is set to a negative value. When data D2 or D4 having a data value "1" is transmitted, the electric potential difference (P−N) is set to a positive value.

Referring to FIG. 19, the transmitting signal P is outputted from the terminal 121A of the semiconductor device 102 to one of the electrode pads formed on the mother board via a wire 151A, a connection wiring conductor 142A, and a via conductor 144A. In addition, the transmitting signal N is outputted from the terminal 121B of the semiconductor device 102 to another electrode pad of the mother board via a wire 151B, the connection wiring conductor 142B, and a via conductor 144B. FIG. 21 is a timing chart showing received signals P1 and N1 when the transmitting signals of FIG. 20 are received by a pair of electrode pads formed on the mother board. As mentioned above, the lengths of the connection wiring conductors 142A and 142B are different from each other. Therefore, as shown in FIG. 21, a phase difference A1 is generated between the received signals P1 and N1. When a magnitude of this phase difference A1 is sufficiently smaller than the time cycle T of the differential signals, it is possible to transmit the data D1 to D4 accurately. However, when the magnitude of the phase difference A1 becomes so large that it can no more be disregarded as compared to the time cycle T of the differential signals, it is impossible to transmit the data D1 to D4 accurately. In particular, as the time cycle T of the differential signals becomes shorter, the influences of the phase difference A1 becomes larger, and this leads to such a problem that the data cannot be transmitted accurately by the differential transmission.

It is an object of the present invention to provide a semiconductor apparatus and an interposer substrate thereof each capable of solving the above-mentioned problems, and capable of transmitting high-frequency signals with accuracy higher than that of prior art.

Solution to Problem

According to the first aspect of the invention, there is provided an interposer substrate for use in a semiconductor apparatus. The semiconductor apparatus includes the interposer substrate provided between a semiconductor device and a mother board. The semiconductor device is implemented on a surface of the interposer substrate and having a plurality of terminals. The interposer substrate has a ground conductor, and the mother board includes a plurality of electrode pads. A plurality of signals are transmitted between the plurality of terminals of the semiconductor device and the plurality of electrode pads formed on the mother board via a plurality of signal lines formed on the interposer substrate. Each of the signal lines includes a connection wiring conductor formed on the surface of the interposer substrate, a via conductor, and a strip conductor formed on the surface of the interposer substrate. The connection wiring conductor has one end electrically connected to one of the plurality of terminals of the semiconductor device. The via conductor has one end connected to another end of the connection wiring conductor and another end electrically connected to one of the plurality of electrode pads formed on the mother board. The strip conductor has one end connected to one end of the via conductor and another end of an open end. The strip conductors and the ground conductor are formed so that at least one of the strip conductors and the ground conductor are opposed to each other so as to form at least one capacitor. A capacitance of the capacitor is adjusted so that phases of the signals transmitted via the respective signal lines have a predetermined relationship at one end of each of the signal lines.

In the above-mentioned interposer substrate, at least one of the strip conductors has a meander shape.

In addition, in the above-mentioned interposer substrate, the meander shape is a folded shape obtained by folding back a straight line.

Further, in the above-mentioned interposer substrate, a width of at least one of the strip conductors is larger than widths of the other strip conductors.

Still further, in the above-mentioned interposer substrate, at least one of the signal lines further includes at least one further strip conductor formed on the surface of the interposer substrate so as to be opposed to the ground conductor, where the further strip conductor has one end connected to one end of one of the via conductors and another end of an open end.

In addition, in the above-mentioned interposer substrate, at least one of the strip conductors has a branched shape.

Further, in the above-mentioned interposer substrate, the ground conductor is opposed to at least a part of each of the strip conductors so as to form the capacitor.

Still further, in the above-mentioned interposer substrate, the ground conductor is formed on the surface of the interposer substrate.

In addition, in the above-mentioned interposer substrate, the plurality of signal lines includes first and second signal lines for transmitting a pair of differential signals. A capacitance of a first capacitor formed by a strip conductor of the first signal line and the ground conductor and a capacitance of a second capacitor formed by a strip conductor of the second signal line and the ground conductor are adjusted so that a phase difference between the pair of differential signals is substantially equal to 180 degrees at one of (a) a pair of terminals of the semiconductor device connected to the first and second signal lines and (b) a pair of electrode pads formed on the mother board connected to the first and second signal lines.

Further, in the above-mentioned interposer substrate, a width of the strip conductor of the first signal line and a width of the strip conductor of the second signal line are different from each other.

Still further, in the above-mentioned interposer substrate, only the strip conductor of one of the first and second signal lines and the ground conductor form the capacitor.

In addition, in the above-mentioned interposer substrate, the plurality of signal lines includes third and fourth signal lines for transmitting a pair of transmitting signals. A capacitance of a third capacitor formed by a strip conductor of the third signal line and the ground conductor and a capacitance of a fourth capacitor formed by a strip conductor of the fourth signal line and the ground conductor are adjusted so that a phase difference between the pair of transmitting signals is substantially equal to 0 degrees at one of (a) a pair of terminals of the semiconductor device connected to the third and fourth signal lines and (b) a pair of electrode pads formed on the mother board connected to the third and fourth signal lines.

Further, in the above-mentioned interposer substrate, the connection wiring conductors and the strip conductors are formed on the surface of the interposer substrate by performing a plating treatment, respectively.

According to the second aspect of the invention, there is provided a semiconductor apparatus including the above-mentioned interposer substrate, and the semiconductor device implemented on the interposer substrate.

The above-mentioned semiconductor apparatus further includes a plurality of solder balls formed on a back surface of the interposer substrate, where each of the plurality of solder balls is electrically connecting another end of each of the via conductors to each of electrode pads formed on the mother board.

ADVANTAGEOUS EFFECTS OF INVENTION

According to an interposer substrate of the present invention and a semiconductor apparatus including the interposer substrate, a plurality of signals are transmitted between a plurality of terminals of a semiconductor device and a plurality of electrode pads formed on a mother board via a plurality of signal lines formed on the interposer substrate. Each of the signal lines includes a connection wiring conductor formed on the surface of the interposer substrate, via conductor, and a strip conductor formed on the surface of the interposer substrate. The connection wiring conductor has one end electrically connected to one of the plurality of terminals of the semiconductor device, the via conductor has one end connected to another end of the connection wiring conductor and another end electrically connected to one of the plurality of electrode pads formed on the mother board, and the strip conductor has one end connected to one end of the via conductor and another end of an open end. The strip conductors and the ground conductor are formed so that at least one of the strip conductors and the ground conductor are opposed to each other so as to form at least one capacitor. A capacitance of the capacitor is adjusted so that phases of the signals transmitted via the respective signal lines have a predetermined relationship at one end of each of the signal lines. Therefore, it is possible to transmit high-frequency digital signals with accuracy higher than that of prior art.

BRIEF DESCRIPTION OF DRAWINGS

FIG. 19 is a plan view of an interposer substrate 104P according to prior art, on which a semiconductor device 102 is implemented.

FIG. 20 is a timing chart showing a transmitting signal P outputted from a terminal 121A of the semiconductor device 102 of FIG. 19 and a transmitting signal N outputted from a terminal 121B.

FIG. 21 is a timing chart showing received signals P1 and N1 when the transmitting signals of FIG. 20 are received by a pair of electrode pads formed on a mother board.

DESCRIPTION OF EMBODIMENTS

Figure 1:
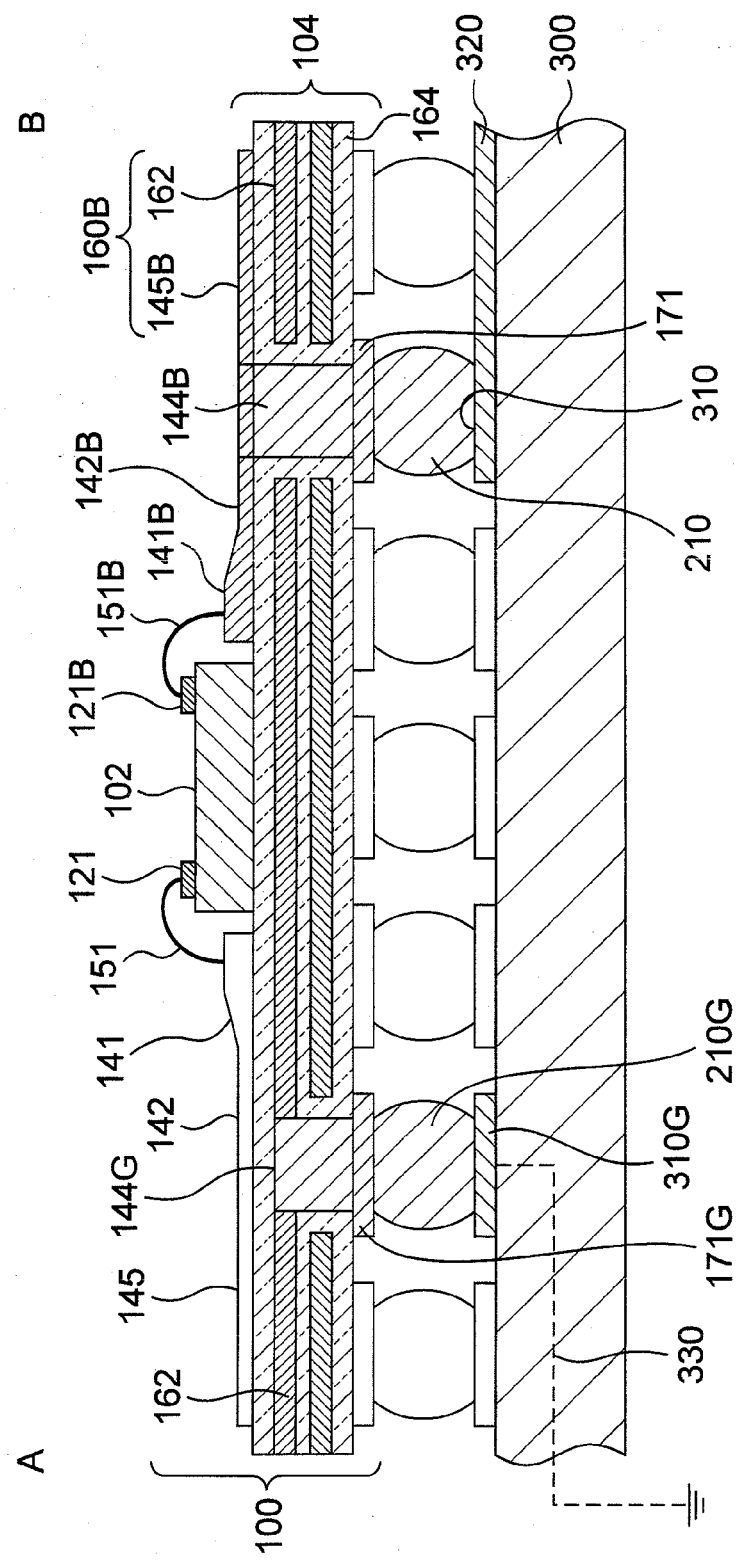
FIG. 1 is a cross-sectional (which is taken along a line A-B of FIG. 2) view of a semiconductor apparatus 100 according to a first embodiment of the present invention.

Preferred embodiments according to the present invention will be described below with reference to the attached drawings. Components similar to each other are denoted by the same reference numerals and will not be described herein in detail.

First Embodiment

Figure 2:
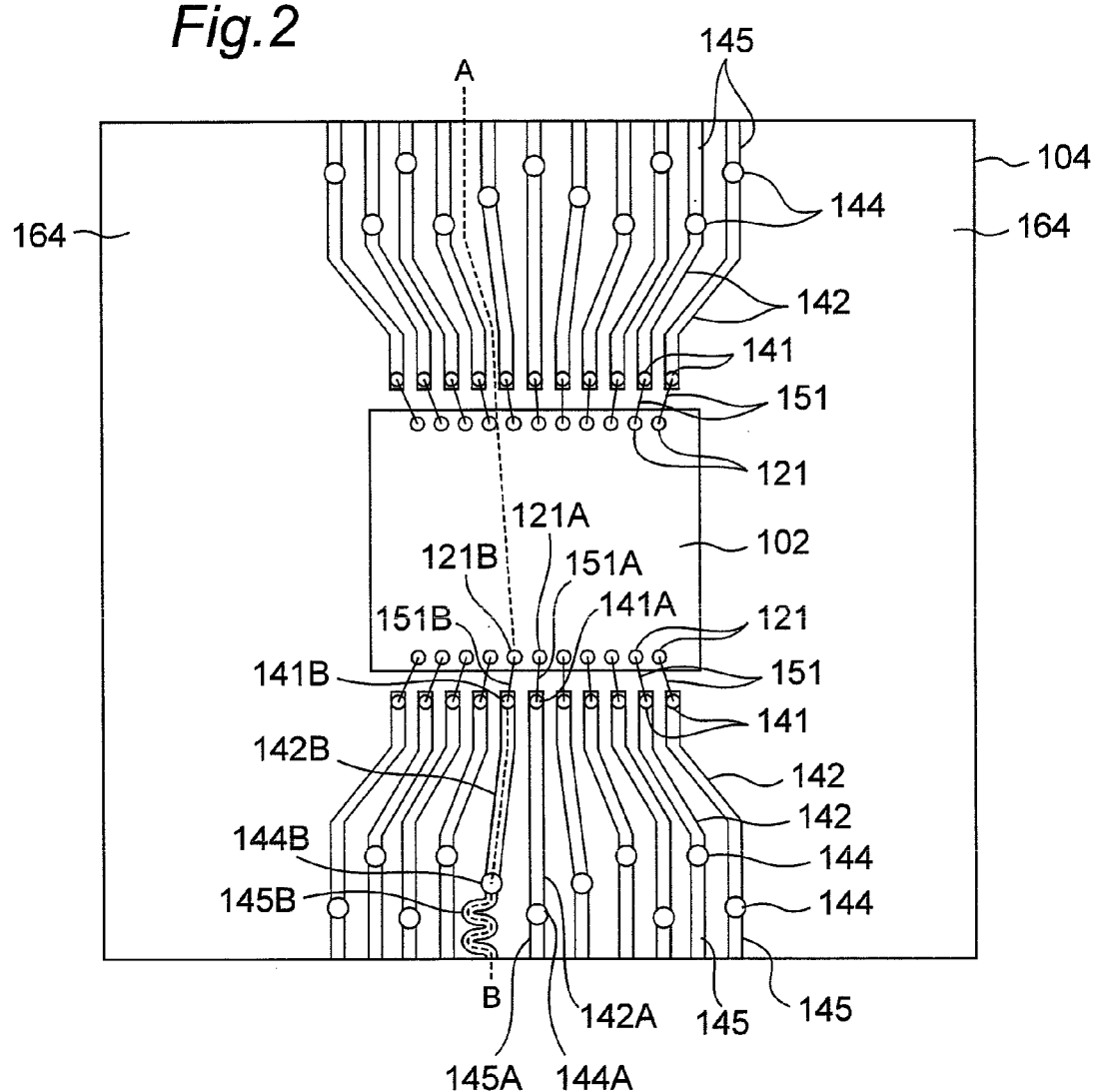
FIG. 2 is a plan view of an interposer substrate 104 of FIG. 1.
Figure 3:
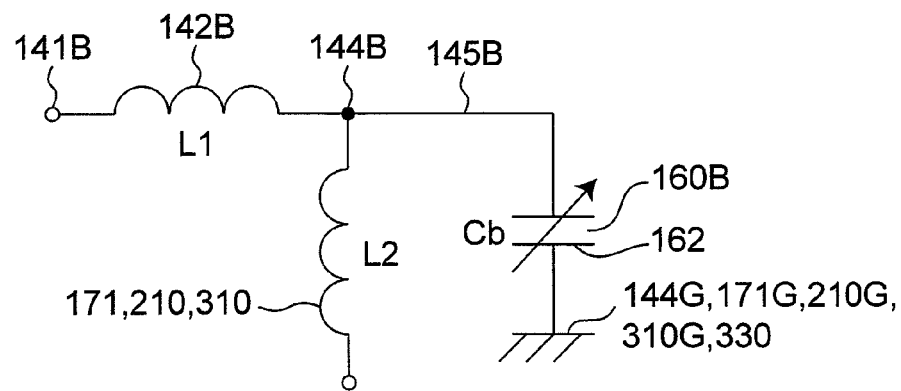
FIG. 3 is an equivalent circuit diagram of signal lines including a connection wiring conductor 142B of FIG. 2.
Figure 4:
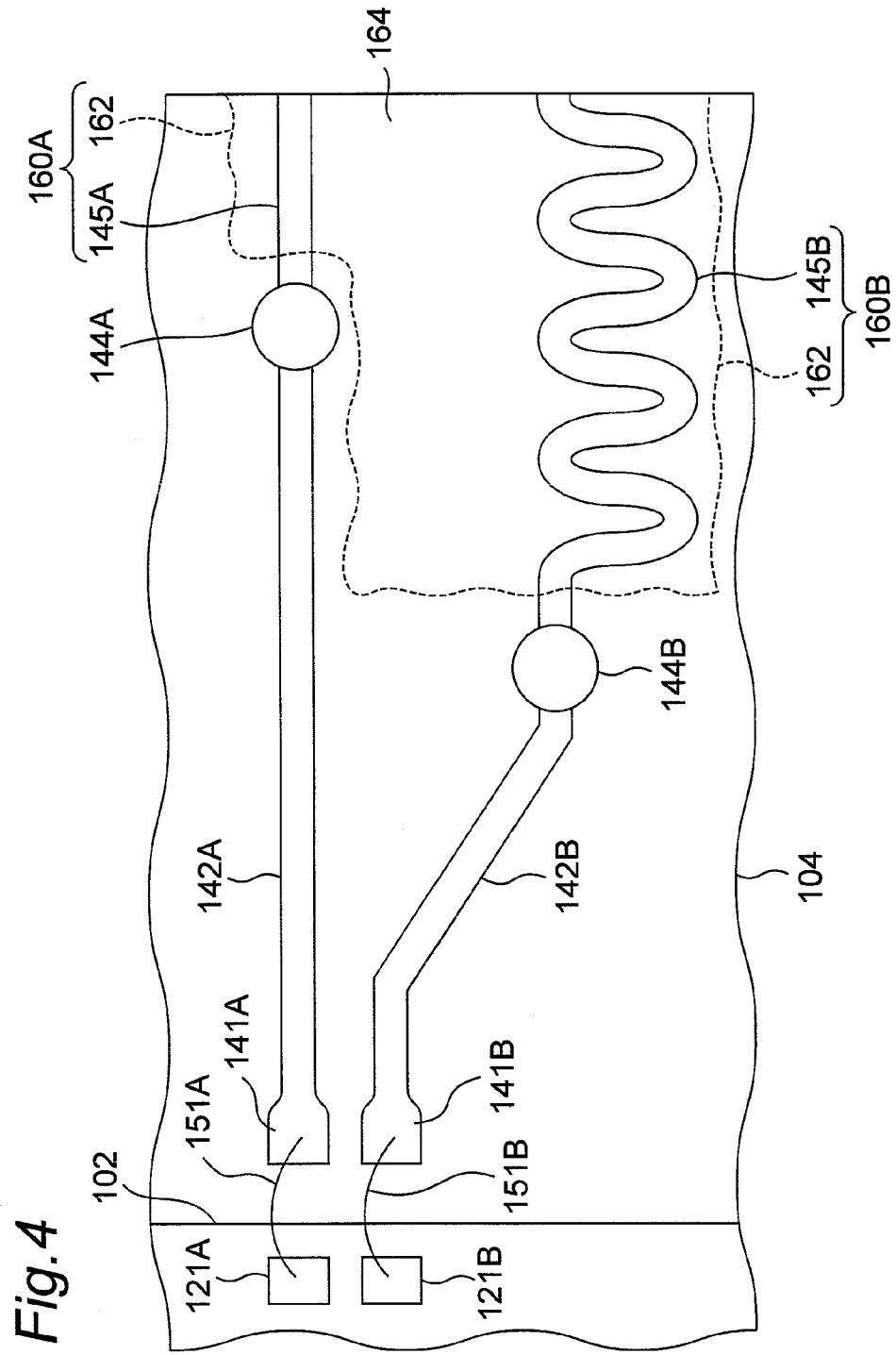
FIG. 4 is an enlarged view of the interposer substrate 104 of FIG. 2 including plating stub conductors 145A and 145B.

FIG. 1 is a cross-sectional (which is taken along a line A-B of FIG. 2) view of a semiconductor apparatus 100 according to a first embodiment of the present invention, and FIG. 2 is a plan view of an interposer substrate 104 of FIG. 1, and FIG. 4 is an enlarged view of the interposer substrate 104 of FIG. 2 including plating stub conductors 145A and 145B. In addition, FIG. 3 is an equivalent circuit diagram of signal lines including a connection wiring conductor 142B of FIG. 2. It is to be noted that connection wiring conductors 142 other than the connection wiring conductors 142A and 142B and components connected to the same connection wiring conductors 142 are not shown in FIGS. 4 and 9 to 17.

Referring to FIG. 1, the interposer substrate 104 is an interposer substrate for use in the semiconductor apparatus 100 which includes the interposer substrate 104 provided between a semiconductor device 102 and a mother board 300. The semiconductor device 102 is implemented on a surface of the interposer substrate 104, and has a plurality of terminals 121. The interposer substrate has a ground conductor 162, and the mother board 300 includes a plurality of electrode pads 310. A plurality of signals are transmitted between the plurality of terminals 102 of the semiconductor device 102 and the plurality of electrode pads 310 formed on the mother board 300 via a plurality of signal lines formed on the interposer substrate 104. In this case, each of the signal lines includes a connection wiring conductor 142 formed on the surface of the interposer substrate 104, a via conductor 144, and a plating stub conductor 145 of a strip conductor formed on the surface of the interposer substrate 104. The connection wiring conductor 142 has one end electrically connected to one of the plurality of terminals 121 of the semiconductor device 102, the via conductor 144 has one end connected to another end of the connection wiring conductor 142 and another end electrically connected to one of the plurality of electrode pads 310 formed on the mother board 300, and the plating stub conductor 145 has one end connected to one end of the via conductor 144 and another end of an open end. Further, the present invention is characterized in that the plating stub conductors 145 and the ground conductor 162 are formed so that at least one of the plating stub conductors 145 and the ground conductor 162 are opposed to each other so as to form capacitors 160A and 160B, and that capacitance Cb of the capacitor 160B is adjusted so that phases of the signals transmitted via the respective signal lines have a predetermined relationship at one end of each of the signal lines.

Referring to FIGS. 1 and 2, the semiconductor apparatus 100 is configured to include the semiconductor device 102 and the interposer substrate 104, on which the semiconductor device 102 is implemented, and the semiconductor apparatus 100 is implemented on the mother board 300 using a plurality of solder balls 210 including a solder ball 210G. The semiconductor device 102 is an IC chip into which an LSI is built. The LSI is provided for processing high-frequency digital signals having a frequency of about 2 GHz such as digital television broadcasting signals at a processing rate of 1 Gbps to 5 Gbps. The semiconductor device 102 includes the plurality of terminals 121 for inputting and outputting the high-frequency digital signals.

In addition, referring to FIGS. 1 and 2, the interposer substrate 104 is provided to electrically connect the terminals 121 of the semiconductor device 102 to the electrode pads 310 formed on the mother board 300, respectively. In the present embodiment, the interposer substrate 104 has a size of 2 cm×2 cm×100 μm. The interposer substrate 104 is configured to include a plurality of connection terminals 141, a plurality of connection wiring conductors 142 and a plurality of plating stub conductors 145 of strip conductors formed on a surface of the insulating layer 164 made of dielectric, a plurality of via conductors 144 formed in the insulating layer 164, a plurality of electrode pads 171 formed on a back surface of the insulating layer 164, and the ground conductor 162 formed in the insulating layer 164. In this case, the ground conductor 162 is connected to a ground wiring 330 of the mother board 300 via one via conductors 144G selected from among a plurality of via conductors 144, one electrode pad 171G selected from among a plurality of electrode pads 171, the solder ball 171G, and an electrode pad 310G formed on the mother board 300.

The connection terminals 141 are provided so as to correspond to the plurality of terminals 121 of the semiconductor device 102, respectively, and wire-bonded to the connection terminals 121 using wires 151. In each of the connection wiring conductors 142, one end of the connection wiring conductor 142 is connected to one connection terminal 141 and another end of the connection wiring conductor 142 is connected to one end of one via conductor 144. In this case, the connection wiring conductors 142 are formed so that a spacing of the connection wiring conductors 142 becomes larger as distances from the connection terminals 141 become larger. The via conductors 144 are interlayer connector parts. In each of the via conductors 144, another end of the via conductor 144 is electrically connected to one electrode pad 171 formed on the back surface of the interposer substrate 104. Referring to FIG. 2, an outside diameter of each of the via conductors 144 is larger than a width of each of the connection wiring conductors 142. In addition, in order to miniaturize the interposer substrate 104, locations of the via conductors 144 connected to the adjacent connection wiring conductors 142 are displaced from each other so that distances of the via conductors 144 from an outer edge part of the interposer substrate 104 are different from each other. Further, the solder balls 210 are formed on the electrode pads 171, respectively. The interposer substrate 104 is electrically connected to the electrode pads 310 formed on the mother board 300 and signal wirings 320 formed on the mother board 300 via the solder balls 210.

The connection terminals 141 on the interposer substrate 104 are subjected to a noble metal plating (for example, a gold plating) treatment using electroplating. During this noble metal plating treatment, an electric current is applied to each of the connection terminals 141 via the plating stub conductors 145 and the connection wiring conductors 142 formed on the interposer substrate 104 from the outer edge part of the interposer substrate 104. In each of the plating stub conductors 145, one end of the plating stub conductor 145 is connected to the connection wiring conductor 142 via the via conductor 144, and another end of the plating stub conductor 145 is an open end which forms an open end portion on the outer edge part of the interposer substrate 104. After the application of the current, another end of each of the plating stub conductors 145 remains open. It is to be noted that the respective connection wiring conductors 142 and the respective plating stub conductors 145 are formed on the surface of the interposer substrate 104 by a plating treatment.

By configuring the semiconductor apparatus 100 as described above, the high-frequency digital signals are transmitted and received between the terminals 121 of the semiconductor device 102 and the electrode pads 310 formed on the mother board via the wires 151, connection terminals 141, connection wiring conductors 142, via conductors 144, electrode pads 171, and solder balls 210, respectively. On the interposer substrate 104, each set of one connection wiring conductor 142, one via conductor 144, and one plating stub conductor 145 electrically connected to each other constitute a signal line for transmitting and receiving the high-frequency digital signal between one terminal 121 of the semiconductor device 102 and one electrode pad 310 of the mother board 300.

Next, there will be described an operation when a pair of differential signals of the high-frequency digital signals are transmitted by a differential transmission using a pair of signal lines (first and second signal lines) including the two connection wiring conductors 142A and 142B selected from among a plurality of connection wiring conductors 142. As shown in FIG. 2, one end of the connection wiring conductor 142A is connected to one connection terminal 141A selected from among a plurality of connection terminals 141, and another end of the connection wiring conductor 142A is connected to one end of one via conductor 144A selected from among a plurality of via conductors 144. Further, the connection terminal 141A is connected to one terminal 121A selected from among a plurality of terminals 121 of the semiconductor device 102 using one wire 141A selected from among a plurality of wires 151. In addition, another end of the via conductor 144A is connected to one solder ball 171 via one electrode pad 171. In a manner similar to that of the connection wiring conductor 142A, one end of the connection wiring conductor 142B is connected to one connection terminal 141 B selected from among a plurality of connection terminals 141, and another end of the connection wiring conductor 142B is connected to one end of one via conductor 144B selected from among a plurality of via conductors 144. Further, the connection terminal 141B is connected to one terminal 121B selected from among a plurality of terminals 121 of the semiconductor device 102 using one wire 141B selected from among a plurality of wires 151. In addition, another end of the via conductor 144B is connected to one solder ball 171 via one electrode pad 171. It is to be noted that the terminals 121A and 121B constitute differential pair of terminals.

In this case, as shown in FIG. 4, the plating stub conductor 145A is formed so as to have a straight line shape having a width the same as a width of the connection wiring conductor 142A. The plating stub conductor 145A and the ground conductor 162 are opposed to each other so as to sandwich the insulating layer 164 to form the capacitor 160A having the capacitance Ca. In addition, the plating stub conductor 145B is formed so as to have a meander shape having a width the same as a width of the connection wiring conductor 142B. The plating stub conductor 145B and the ground conductor 162 are opposed to each other so as to sandwich the insulating layer 164 to form the capacitor 160B having the capacitance Cb.

As shown in FIG. 3, when the high-frequency digital signal is transmitted, the connection wiring conductor 142B behaves as an inductor, which is connected between the connection terminal 141B and the via conductor 144B and has an inductance L1. In addition, the electrode pad 171, the solder ball 210, and the electrode pad 310 behave as an inductor, which is connected to the via conductor 144B and has an inductance L2. Further, at when the high-frequency digital signal is transmitted, the plating stub conductor 145B behaves as an open stub conductor. The plating stub conductor 145B and the ground conductor 162 are opposed to each other so as to form the capacitor 160B having the capacitance Cb. The capacitor 160B delays the high-frequency digital signal transmitted or received via the connection wiring conductor 142B according to the capacitance Cb. In this case, a portion of the plating stub conductor 145B is opposed to the ground conductor 162, and the capacitance Cb becomes larger as an area of the above portion of the plating stub conductor 145B is larger. A longitudinal length (namely, the shape of the meander) of the plating stub conductor 145B determines this area.

In a manner similar to above, the plating stub conductor 145A and the ground conductor 162 are opposed to each other so as to form the capacitor 160A having the capacitance Ca. The capacitor 160A delays the high-frequency digital signal transmitted or received via the connection wiring conductor 142A according to the capacitance Ca. In this case, a portion of the plating stub conductor 145A is opposed to the ground conductor 162, and the capacitance Ca becomes larger as an area of the portion of the plating stub conductor 145A is larger.

In the present embodiment, when the pair of differential signals is transmitted from the semiconductor device 102 to the mother board 300 via the first signal line including the connection wiring conductor 142A and the second signal line including the connection wiring conductor 142B, the capacitance Cb of the capacitor 160B is adjusted so that a phase difference between the pair of differential signals is substantially equal to 180 degrees at a pair of electrode pads 310 formed on the mother board 300 connected to the via conductors 144A and 144B, respectively. In addition, when the pair of differential signals is transmitted from the mother board 300 to the semiconductor device 102, the capacitance Cb of the capacitor 160B is adjusted so that the phase difference between the pair of differential signals is substantially equal to 180 degrees at the pair of terminals 121A and 121B of the semiconductor device 102, respectively.

Figure 5:
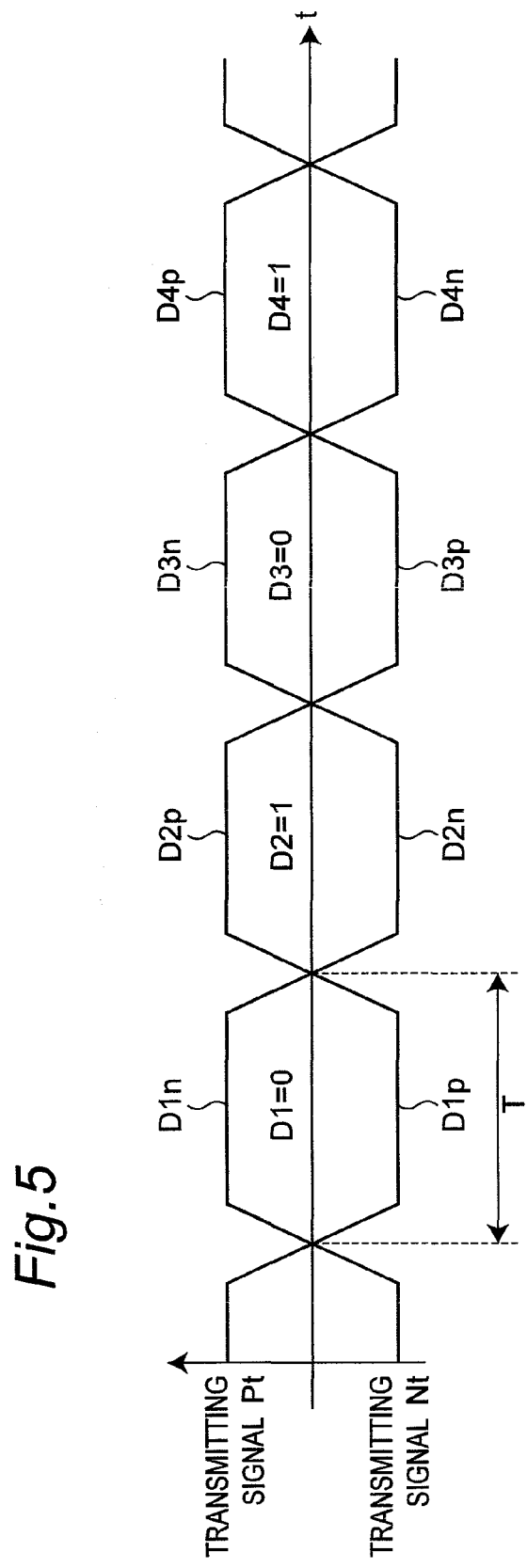
FIG. 5 is a timing chart showing transmitting signals Pt and Nt outputted from terminals 121A and 121B, respectively, when a pair of differential signals is transmitted from a semiconductor device 102 of FIG. 1 to a mother board 300 via a first signal line including a connection wiring conductor 142A and a second signal line including the connection wiring conductor 142B.
Figure 6:
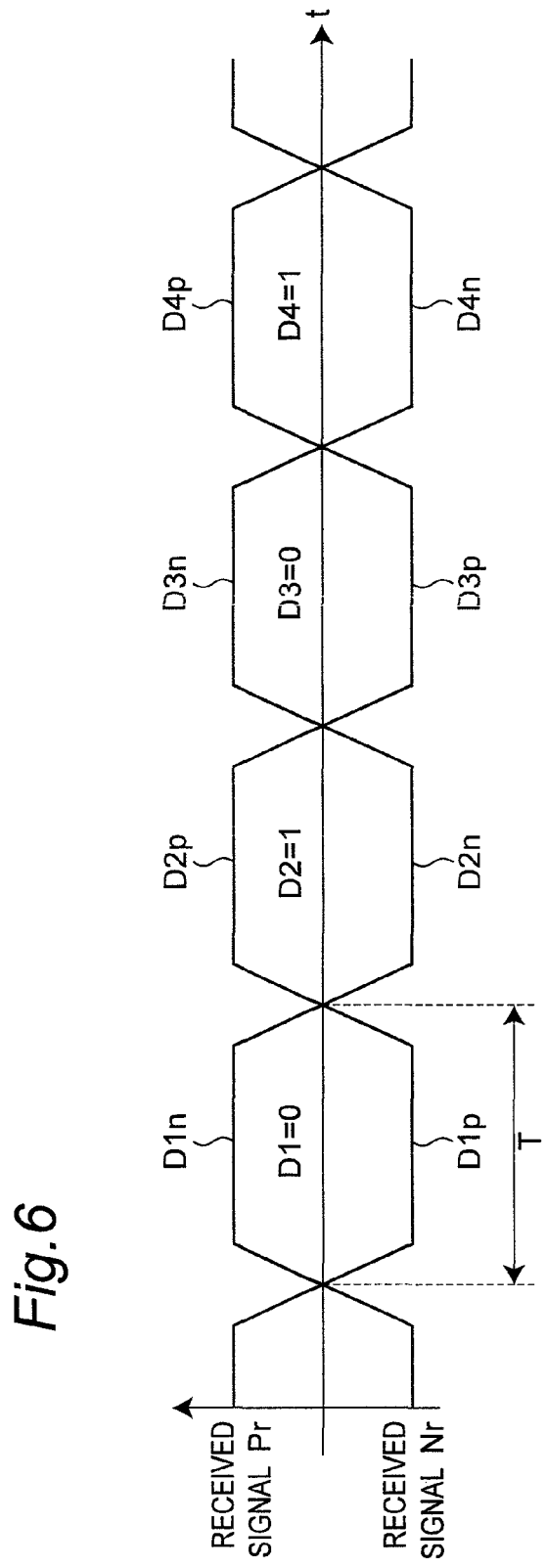
FIG. 6 is a timing chart showing received signals Pr and Nr when the transmitting signals Pt and Rt of FIG. 5 are received by a pair of electrode pads 310 formed on the mother board 300, respectively.

FIG. 5 is a timing chart showing transmitting signals Pt and Nt outputted from the terminals 121A and 121B, respectively, when the pair of differential signals is transmitted from the semiconductor device 102 of FIG. 1 to the mother board 300 via the first signal line including the connection wiring conductor 142A and the second signal line including the connection wiring conductor 142B. In addition, FIG. 6 is a timing chart showing received signals Pr and Nr when the transmitting signals Pt and Rt of FIG. 5 are received by a pair of electrode pads 310 formed on the mother board 300, respectively. Referring to FIG. 5, the transmitting signals Pt and Nt have a time cycle T, and constitute the pair of differential signals. In the differential transmission, data "1" or "0" is transmitted using an electric potential difference (P–N) between the transmitting signals Pt and Nt having a phase difference of 180 degrees, as shown in FIG. 5. For example, referring to FIG. 5, when data D1 or D3 having a data value "0" is transmitted, the electric potential difference (P–N) is set to a negative value. When data D2 or D4 having a data value "1" is transmitted, the electric potential difference (P–N) is set to a positive value. In addition, as shown in FIG. 6, when the transmitting signals Pt and Rt of FIG. 5 are received by the pair of electrode pads 310 formed on the mother board 300 as the received signals Pr and Nr, respectively, the phase difference between the received signals Pr and Nr is adjusted to be substantially equal to 180 degrees in the present embodiment. Therefore, the data D1 to D4 can be transmitted with accuracy higher than that of prior art.

Next, there will be described an operation when a pair of transmitting signals of the high-frequency digital signals are transmitted by single-ended transmission using a pair of signal lines (third and fourth signal lines) including the two connection wiring conductors 142A and 142B selected from among a plurality of connection wiring conductors 142. In the present embodiment, when the pair of differential signals is transmitted from the semiconductor device 102 to the mother board 300 via the third signal line including the connection wiring conductor 142A and the fourth signal line including the connection wiring conductor 142B, the capacitance Cb of the capacitor 160B is adjusted so that a phase difference between the pair of differential signals is substantially equal to 0 degrees at the pair of electrode pads 310 formed on the mother board 300 connected to the via conductors 144A and 144B, respectively. In addition, when the pair of transmitting signals is transmitted from the mother board 300 to the semiconductor device 102, the capacitance Cb of the capacitor 160B is adjusted so that the phase difference between the pair of differential signals is substantially equal to 0 degrees at the pair of terminals 121A and 121B of the semiconductor device 102, respectively.

Figure 7:
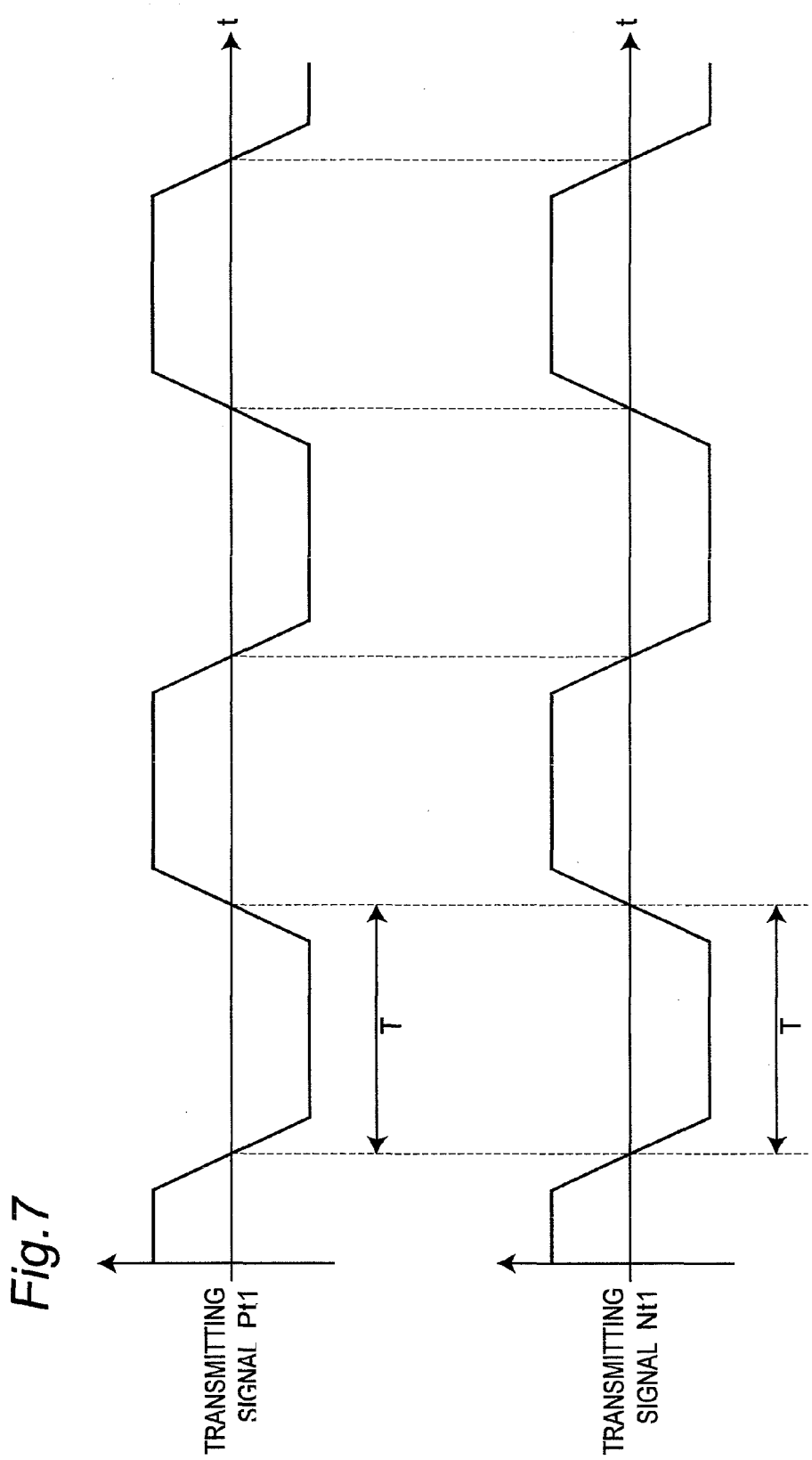
FIG. 7 is a timing chart showing transmitting signals Pt1 and Nt1 outputted from the terminals 121A and 121B, respectively, when a pair of transmitting signals is transmitted from the semiconductor device 102 of FIG. 1 to the mother board 300 via a third signal line including the connection wiring conductor 142A and a fourth signal line including the connection wiring conductor 142B.
Figure 8:
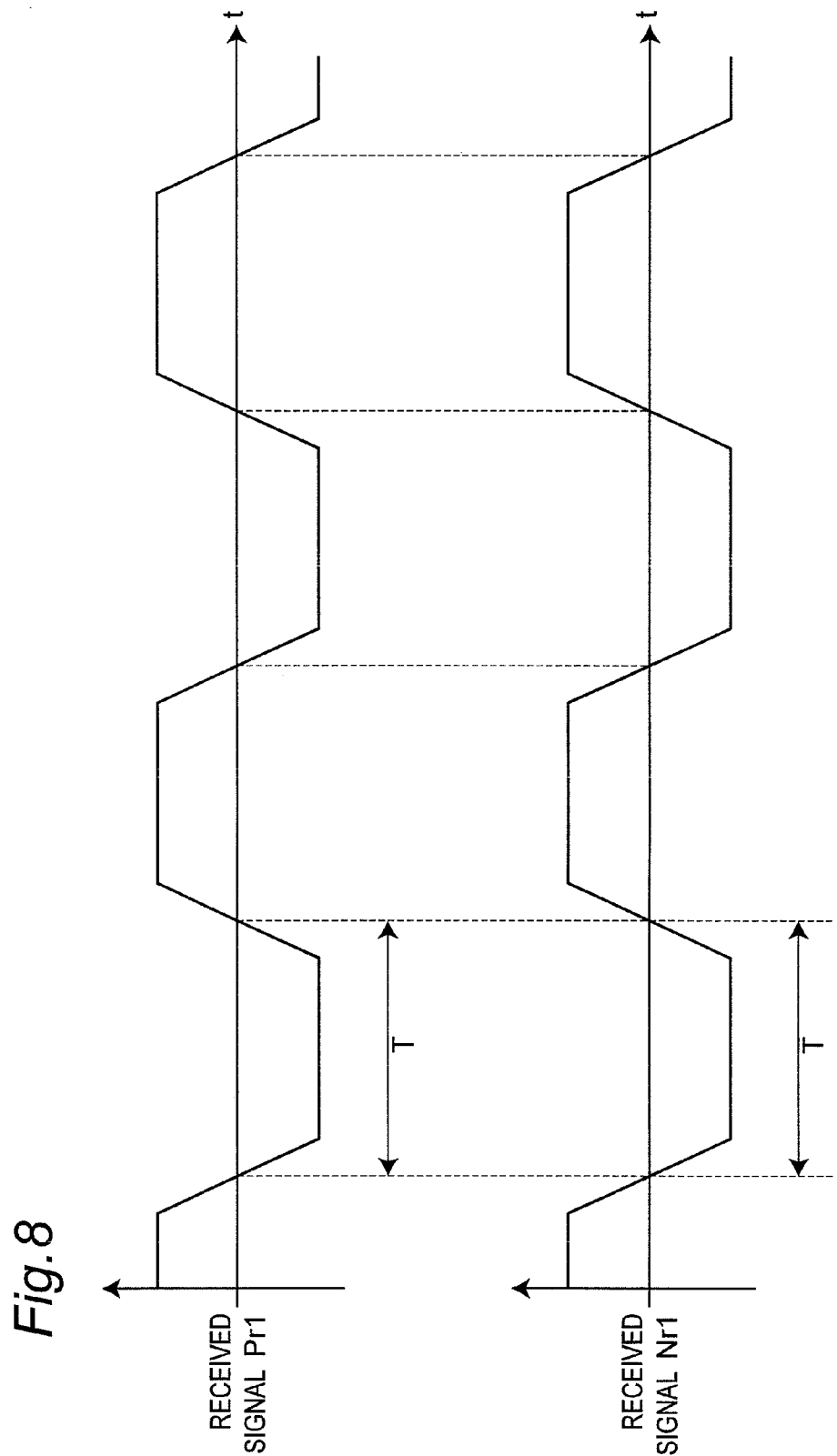
FIG. 8 is a timing chart showing received signals Pr1 and Nr1 when the transmitting signals Pt1 and Rt1 of FIG. 7 are received by the pair of electrode pads 310 formed on the mother board 300, respectively.

FIG. 7 is a timing chart showing transmitting signals Pt1 and Nt1 outputted from the terminals 121A and 121B, respectively, when the pair of transmitting signals is transmitted from the semiconductor device 102 of FIG. 1 to the mother board 300 via the third signal line including the connection wiring conductor 142A and the fourth signal line including the connection wiring conductor 142B. In addition, FIG. 8 is a timing chart showing received signals Pr1 and Nr1 when the transmitting signals Pt1 and Rt1 of FIG. 7 are received by the pair of electrode pads 310 formed on the mother board 300, respectively. Referring to FIG. 7, the transmitting signals Pt1 and Nt1 have the time cycle T, and constitute a pair of transmitting signals having phases the same as each other. In addition, as shown in FIG. 8, when the transmitting signals Pt1 and Rt1 of FIG. 7 are received by the pair of electrode pads 310 formed on the mother board 300 as the received signals Pr1 and Nr1, respectively, the phase difference between the received signals Pr1 and Nr1 is adjusted to be substantially equal to 0 degrees in the present embodiment. Therefore, as compared with prior art, it is possible to improve processing accuracy with which the received signals Pr1 and Nr1 are related to each other and processed on the mother board 300.

Next, advantageous effects exhibited by the interposer substrate 104 according to the present embodiment will be described. When the differential transmission is performed using the first and second signal lines including the connection wiring conductors 142A and 142B, differential signals having a phase difference of 180 degrees are inputted to one end of the connection wiring conductor 142A and one end of the connection wiring conductor 142B, respectively. However, as described above, according to the prior art, the phase difference between the differential signals outputted from another ends of the connection wiring conductors 142A and 142B is shifted from 180 degrees due to the difference in the lengths of the connection wiring conductors 142A and 142B and the difference in the electric resistances of the connection wiring conductors 142A and 142B. For example, the inventors of the present invention calculated the difference in transmission times of the received differential signals by a simulation made based on design CAD data and the like of the mother board 300 and the semiconductor apparatus 100, and obtained the following results. When microstrip wirings each having a wiring width of 50 μm were formed on a glass epoxy board having a thickness of 100 μm, differential signals having a high frequency of 2 GHz were transmitted, and a difference between transmission paths was 2 mm, the difference in the transmission times of the differential signals was about 0.75 picosecond. In this case, the phase difference between the differential signals is shifted from 180 degrees by about 10%. In this way, a shift amount of the phase difference from 180 degrees becomes so large that it can no more be disregarded as compared to the time cycle of the differential signals having the high frequency of 2 GHz. As a result, such a problem will occur that data cannot be transmitted accurately by the differential transmission.

In order to solve the problem described above, it may be considered to set lengths of the signal wirings 142A and 142B to be equal to each other. However, changes in design of the connection wiring conductors 142 influences design of the other wirings and the like. In addition, the semiconductor device 102 is constituted by the system LSI and the like and highly complicated, and the number of terminals 120 tends to increase (multi-terminal) as compared with that of prior art. Further, degrees of freedom of the lengths of the respective connection wiring conductors 142 and positions of the via conductors 144 are quite low due to reduction in the size of the interposer substrate 104 and space saving. Therefore, it is actually quite difficult to design the lengths of the respective connection wiring conductors 142 and the positions of the via conductors 144 so as to make transmission path lengths of respective signals transmitted via the connection wiring conductors 142 in the same length.

On the other hand, as compared with the interposer substrate 104P according to the prior art shown in FIG. 19, the interposer substrate 104 according to the present embodiment is configured so that a plating stub conductor 145P having the a straight line shape and a width the same as that of the connection wiring conductor 142B is replaced with the plating stub conductor 145B having the meander shape, and so that the ground conductor 162 and the plating stub conductor 145B form the capacitor 160B. Further, the capacitance Cb of the capacitor 160B is adjusted so that the phase difference between the received pair of differential signals is substantially equal to 180 degrees at the pair of terminals 121A and 121B of the semiconductor device 102 or at the pair of electrode pads 310 formed on the mother board 300 connected to the via conductors 144A and 144B.

The plating stub conductors 145 including the plating stub conductors 145A and 145B do not contribute directly to the transmission of the signals between the semiconductor device 102 and the mother board 300. In addition, as shown in FIG. 2, wiring density in a portion near the outer edge part of the interposer substrate 104 in which the plating stub conductors 145 formed outside of the via conductors 144 remain smaller than wiring density near the semiconductor device 102. Therefore, the freedom of design in the portion near the outer edge part of the interposer substrate 104 is larger. In addition, as a component for setting a reference value of an electric potential, the ground conductor 162 connected to the ground wiring 330 of the mother board 300 has been provided in the interposer substrate 104 previously. Therefore, it has a relatively small influence on the design of the other wirings and the like of the interposer substrate 104P according to the prior art, to form the capacitor 160A by the ground conductor 162 and the plating stub conductor 145A and to form the capacitor 160B by the ground conductor 162 and the plating stub conductor 145B according to the present embodiment. Therefore, as compared with the other method such as one for making the connection wiring conductors 142 in the lengths the same as each other, it is possible to adjust the phases of signals inputted and outputted to or from the semiconductor apparatus 100A relatively easily. In addition, it is possible to adjust the length or area of each plating stub conductor 145 since the plating stub conductors 145 are formed by the noble metal plating treatment.

Therefore, according to the present embodiment, it is possible to transmit high-frequency signals with accuracy higher than that of prior art, without influencing the design of wirings such as the connection wiring conductors 142 of the interposer substrate 104P according to the prior art.

It is preferable to set the width of the plating stub conductor 145B to be equal to the width of the connection wiring conductor 142B so as to set characteristic impedance of the plating stub conductor 145B to be the same as characteristic impedance of the connection wiring conductor 142B. With this configuration, no etch rate difference occurs between the plating stub conductor 145B and the connection wiring conductor 142B during the noble metal plating treatment.

In addition, the plating stub conductor 145A may be formed to have the meander shape in a manner similar to that of the plating stub conductor 145B.

Second Embodiment

Figure 9:
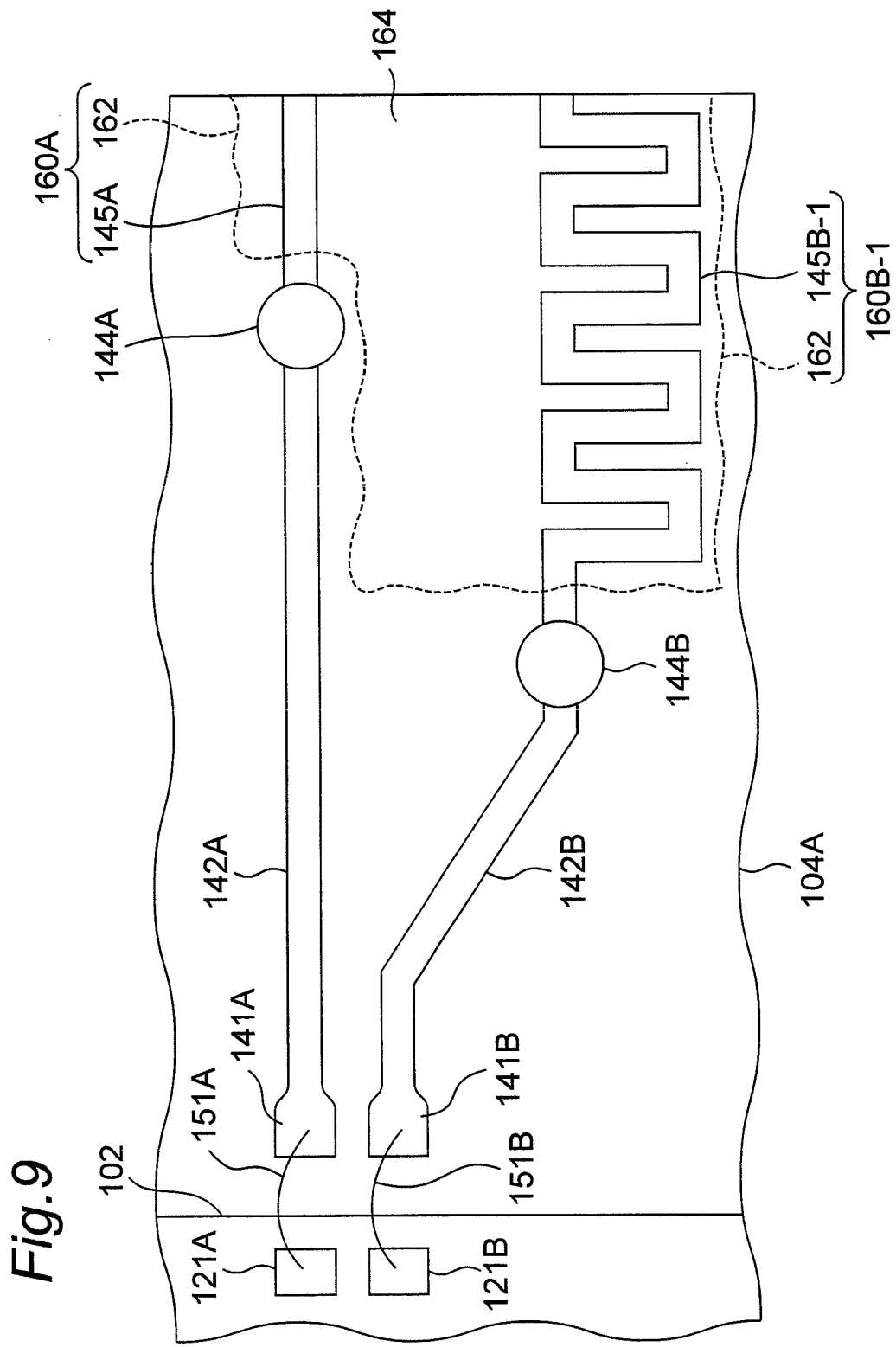
FIG. 9 is an enlarged view of an interposer substrate 104A according to a second embodiment of the present invention including plating stub conductors 145A and 145B-1.

FIG. 9 is an enlarged view of an interposer substrate 104A according to a second embodiment of the present invention including plating stub conductors 145A and 145B-1. As compared with the first embodiment, the present embodiment is characterized in that the plating stub conductor 145B-1 having a folded shape obtained by folding back a straight line is formed instead of the plating stub conductor 145B having the meander shape. Referring to FIG. 9, the plating stub conductor 145B-1 and the ground conductor 162 are opposed to each other so as to sandwich the insulating layer 164 to form a capacitor 160B-1.

According to the present embodiment, as compared with a case of forming the plating stub conductor 145B having the curved shape, it is possible to use space of a surface of the interposer substrate 104A more efficiently, and it is possible to form the plating stub conductor 145B-1 having a length longer than that of the plating stub conductor 145B. Therefore, as compared with the first embodiment, it is possible to increase a capacitance of the capacitor 160B-1, and this leads to an increased delay amount of a signal transmitted via the connection wiring conductor 142B.

It is to be noted that the plating stub conductor 145A may have a folded shape obtained by folding back a straight line in a manner similar to that of the plating stub conductor 145B-1.

Third Embodiment

Figure 10:
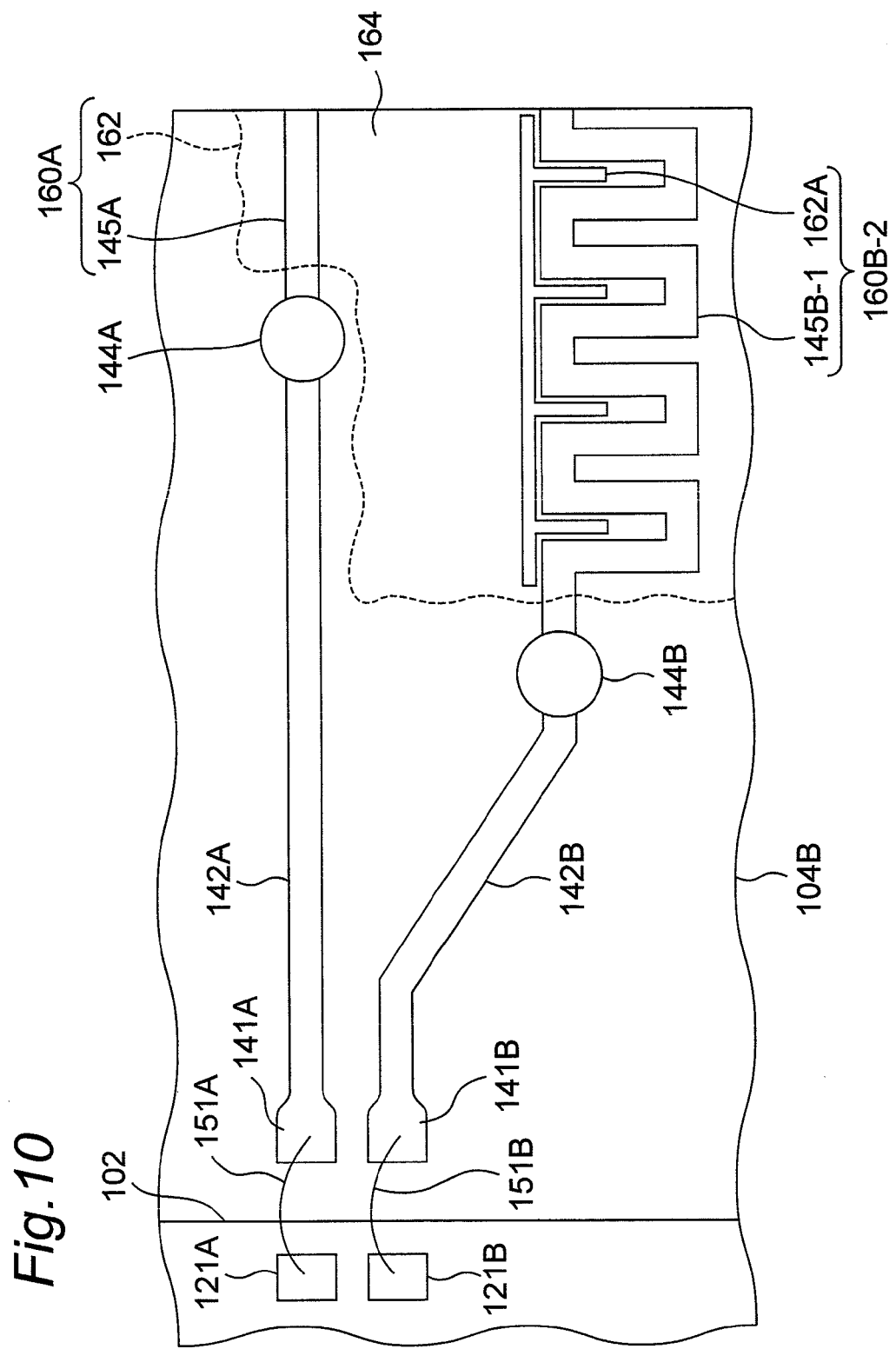
FIG. 10 is an enlarged view of an interposer substrate 104B according to a third embodiment of the present invention including plating stub conductors 145A and 145B-1, and a ground conductor 162A.

FIG. 10 is an enlarged view of an interposer substrate 104B according to a third embodiment of the present invention including plating stub conductors 145A and 145B-1, and a ground conductor 162A. As compared with the second embodiment, the present embodiment is characterized in that the ground conductor 162A having a comb-shape is formed on a surface of the interpose board 104B. Referring to FIG. 10, the plating stub conductor 145B-1 and the ground conductor 162A are opposed to each other so as to form a capacitor 160B-2. By increasing a length of the plating stub conductor 145B-1 and an area of the ground conductor 162A, it is possible to increase a capacitance of the capacitor 160B-2, and this leads to an increased delay amount of a signal transmitted via the connection wiring conductor 142B.

Fourth Embodiment

Figure 11:
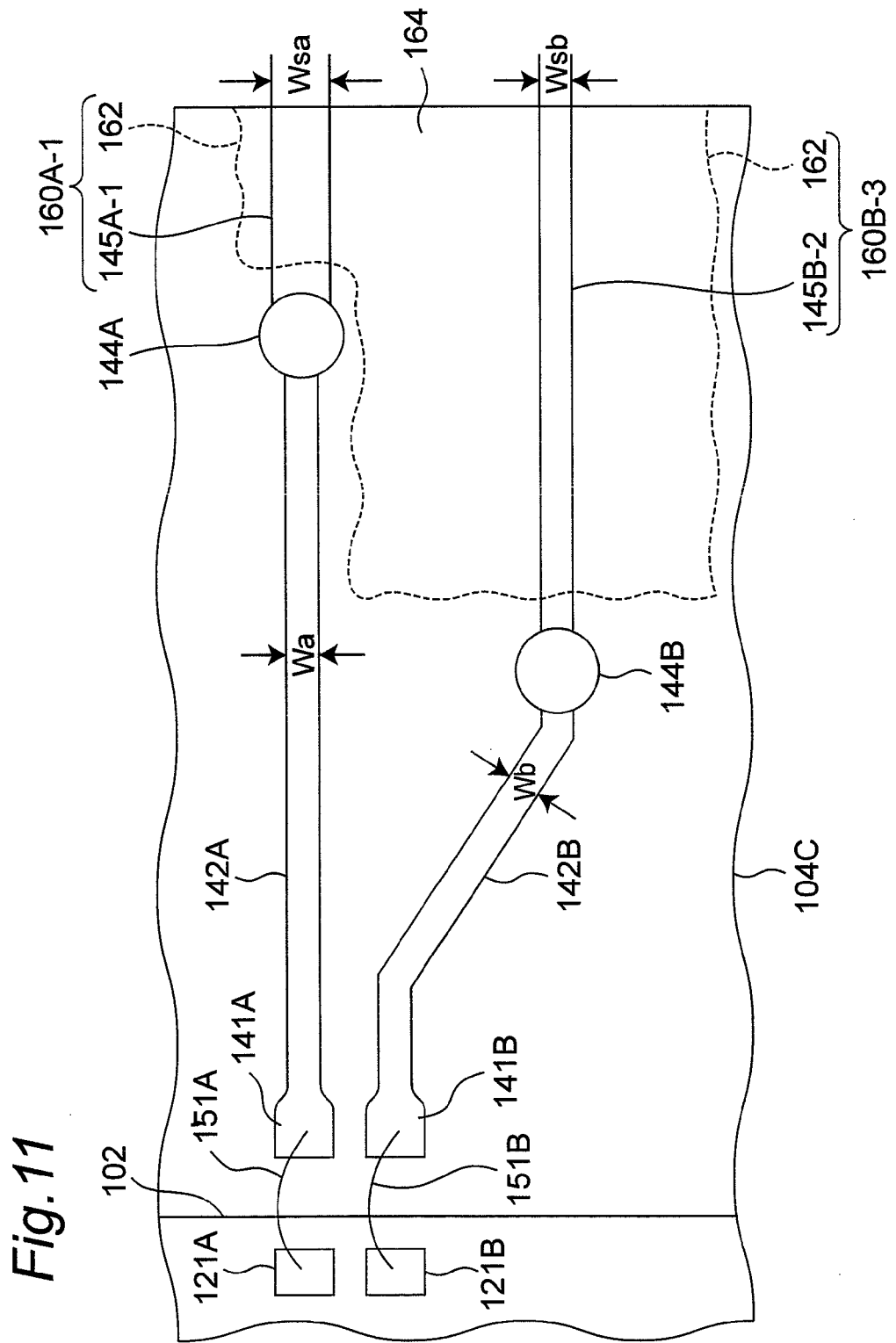
FIG. 11 is an enlarged view of an interposer substrate 104C according to a fourth embodiment of the present invention including plating stub conductors 145A-1 and 145B-2.

FIG. 11 is an enlarged view of an interposer substrate 104C according to a fourth embodiment of the present invention including plating stub conductors 145A-1 and 145B-2. The present embodiment is different from the first embodiment in the following respects.

(a) The plating stub conductor 145A-1, which has a width Wsa larger than a width Wa of the connection wiring conductor 142A and a straight line shape, is formed instead of the plating stub conductor 145A.

(b) The plating stub conductor 145B-2, which has a width Wsb equal to a width Wb of the connection wiring conductor 142B and a straight line shape, is formed instead of the plating stub conductor 145B.

Referring to FIG. 11, the plating stub conductor 145A-1 and the ground conductor 162 are opposed to each other so as to sandwich the insulating layer 164 to form a capacitor 160A-1, and the plating stub conductor 145B-2 and the ground conductor 162 are opposed to each other so as to sandwich the insulating layer 164 to form a capacitor 160B-3. By increasing an area of the plating stub conductor 145A-1 by increasing the width of the plating stub conductor 145A-1, it is possible to increase a capacitance of the capacitor 160A-1. This can increase a delay amount of the signal transmitted via the connection wiring conductor 142A.

It is to be noted that at least one of the plating stub conductors 145A-1 and 145B-2 may have a meander shape or a folded shape obtained by folding back a straight line.

Fifth Embodiment

Figure 12:
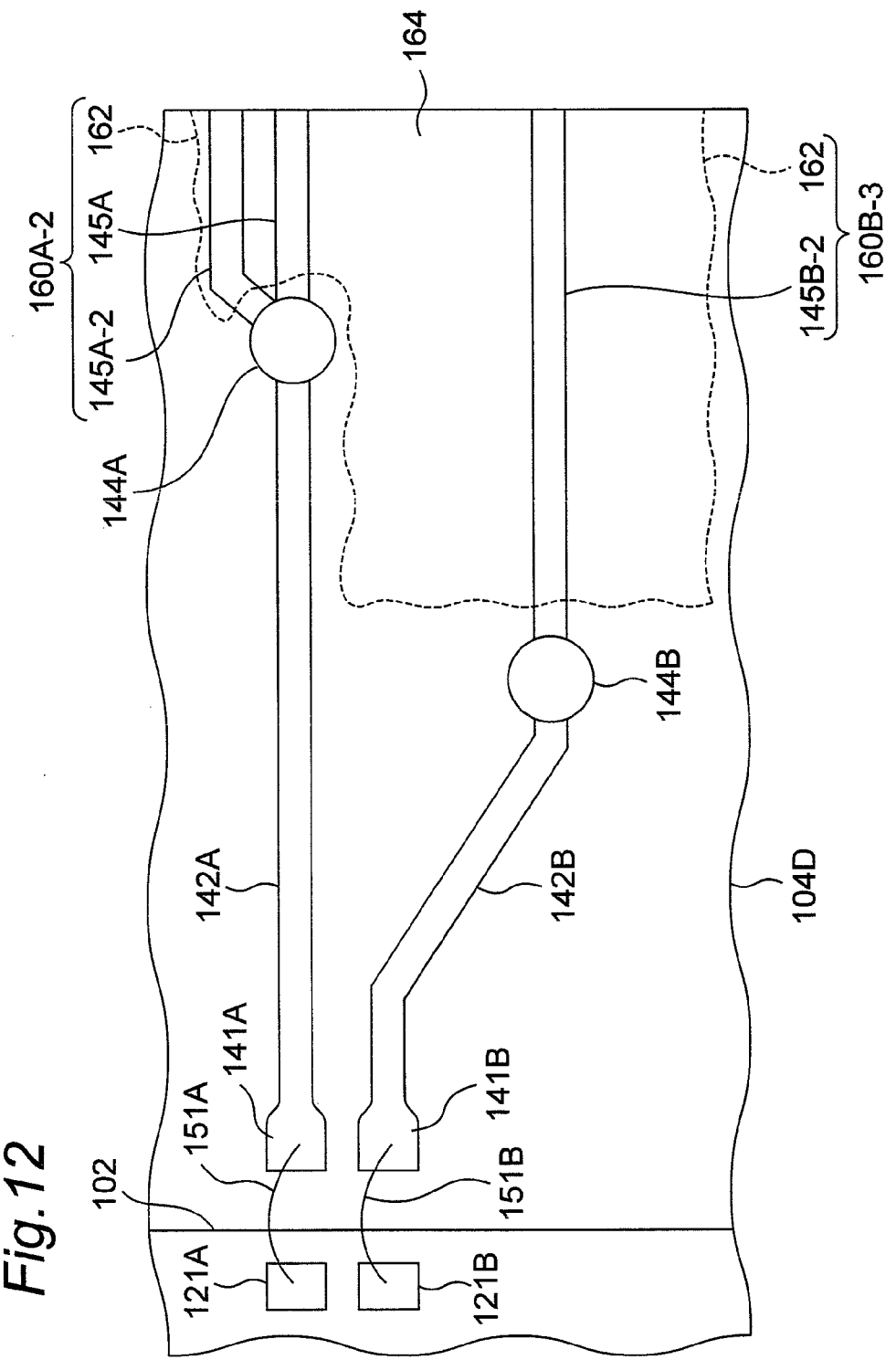
FIG. 12 is an enlarged view of an interposer substrate 104D according to a fifth embodiment of the present invention including plating stub conductors 145A and 145B-2 and a strip conductor 145A-2.

FIG. 12 is an enlarged view of an interposer substrate 104D according to a fifth embodiment of the present invention including plating stub conductors 145A and 145B-2 and a strip conductor 145A-2. The present embodiment is different from the fourth embodiment in that the plating stub conductor 145A according to the first embodiment and the strip conductor 145A-2 having one end connected to the via conductor 144A and another end of an open end are formed instead of the plating stub conductor 145A-1. The plating stub conductors 145A and 145A-2 are opposed to the ground conductor 162. Referring to FIG. 12, the strip conductor 145A-2 behaves as an open stub conductor, the plating stub conductor 145A and the strip conductor 145A-2 are opposed to the ground conductor 152 so as to form a capacitor 160A-2.

According to the present embodiment, by further connecting the strip conductor 145A-2 to the via conductor 144A, an area of the open stub conductor connected to the connection wiring conductor 142A via the via conductor 144A can be increased and a capacitance of the capacitor 160A-2 can be increased. This can increase a delay amount of the signal transmitted via the connection wiring conductor 142A.

In the present embodiment, one strip conductor 145A-2 is connected to the via conductor 144A. However, the present invention is not limited to this. A plurality of conductors each having one end connected to the via conductor 144A and another end of an open end may be formed. In addition, at least one strip conductor having one end connected to the via conductor 144B and another end of an open end may be formed. Further, each of the plating stub conductors 145-2 and 145B-2 and the strip conductor 145-2 may have a meander shape or a folded shape obtained by folding back a straight line. In addition, widths of the plating stub conductors 145-2 and 145B-2 and the strip conductor 145-2 may be different from each other.

Sixth Embodiment

Figure 13:
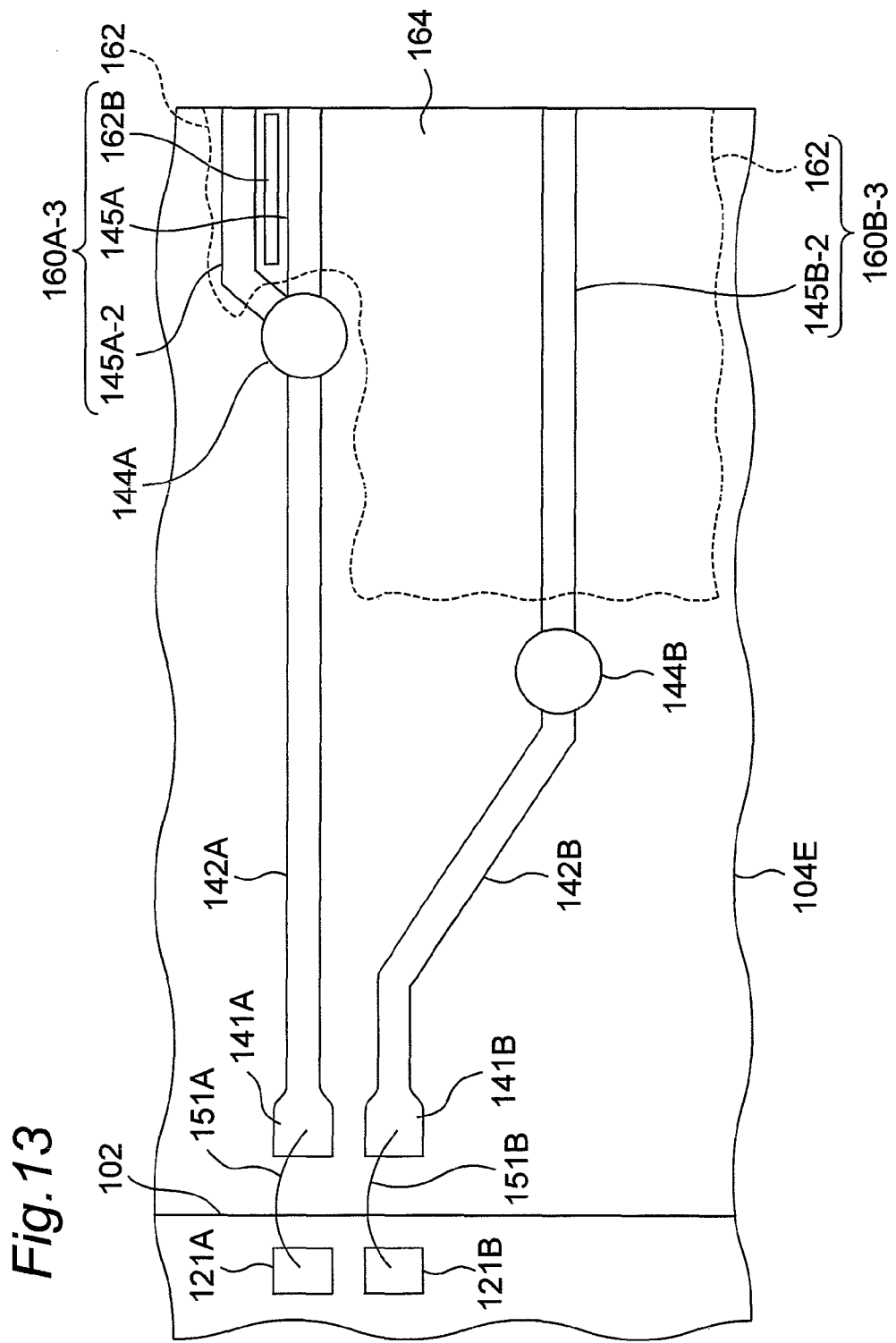
FIG. 13 is an enlarged view of an interposer substrate 104E according to a sixth embodiment of the present invention including the plating stub conductors 145A and 145B-2, the strip conductor 145A-2, and a ground conductor 162B.

FIG. 13 is an enlarged view of an interposer substrate 104E according to a sixth embodiment of the present invention including the plating stub conductors 145A and 145B-2, the strip conductor 145A-2, and a ground conductor 162B. As compared with the fifth embodiment, the present embodiment is characterized in that the ground conductor 162B having a rectangular shape is formed between the plating stub conductors 145A and 145A-2 on a surface of the interposer substrate 104E. Referring to FIG. 13, the plating stub conductor 145A and the strip conductor 145A-2 are opposed to the ground conductor 162B so as to form a capacitor 160A-3. By increasing an area of the ground conductor 162B, it is possible to increase a capacitance of the capacitor 160A-3, and this leads to an increased delay amount of the signal transmitted via the connection wiring conductor 142A.

Seventh Embodiment

Figure 14:
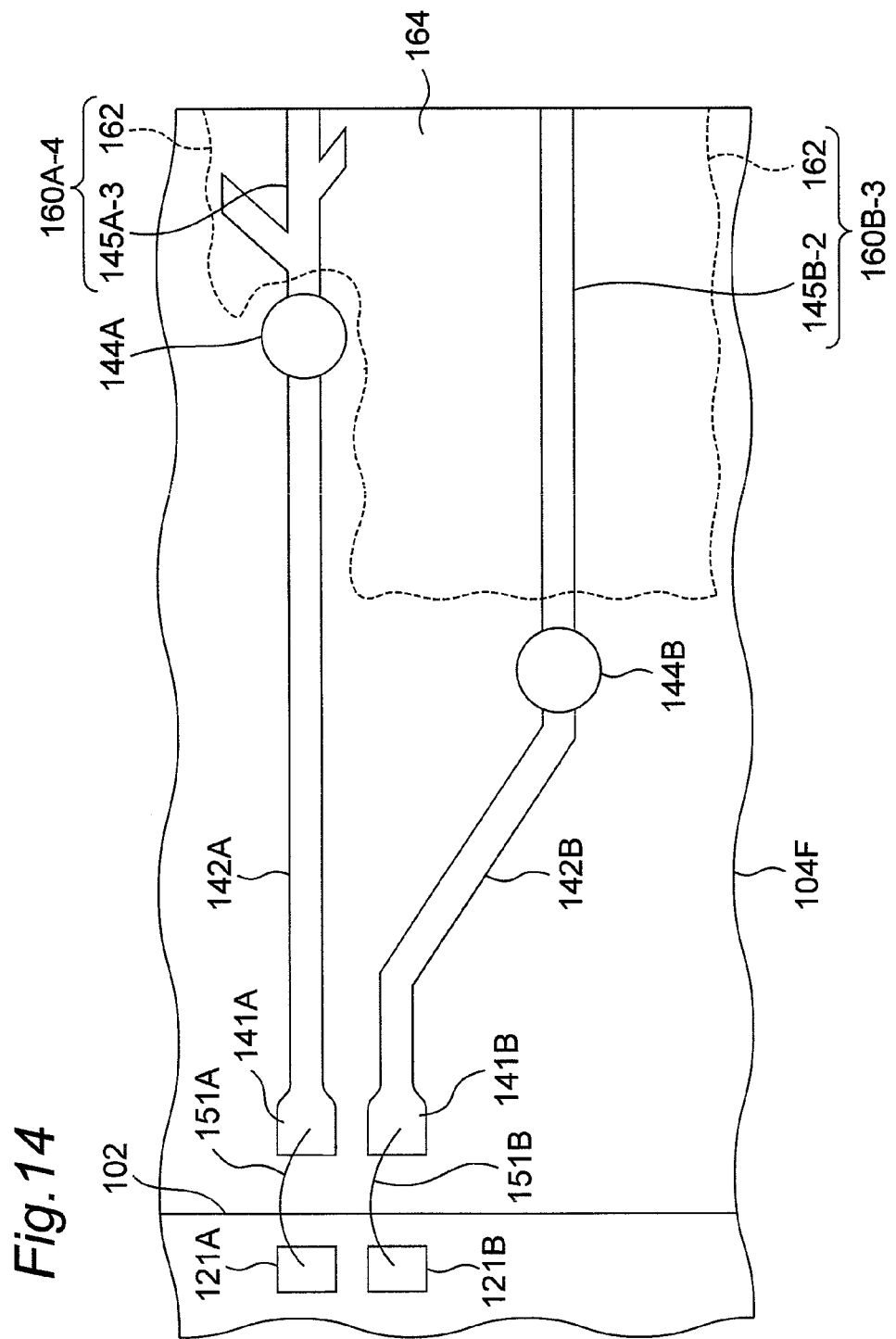
FIG. 14 is an enlarged view of an interposer substrate 104F according to a seventh embodiment of the present invention including plating stub conductors 145A-3 and 145B-2.

FIG. 14 is an enlarged view of an interposer substrate 104F according to a seventh embodiment of the present invention including plating stub conductors 145A-3 and 145B-2. As compared with the fourth embodiment, the present embodiment is characterized in that the plating stub conductor 145A-3 having a branched shape is formed instead of the plating stub conductor 145A-1. Referring to FIG. 14, the plating stub conductor 145A-3 and the ground conductor 162 are opposed to each other so as to form a capacitor 160A-4. By forming the plating stub conductor 145A-3 having the branched shape, it is possible to increase an area of the plating stub conductor 145A-3, and this leads to an increased capacitance of the capacitor 160A-4 and an increased delay amount of the signal transmitted via the connection wiring conductor 142A.

It is to be noted that the plating stub conductor 145B-2 may be formed so as to have the branched shape, a meander shape or a folded shape obtained by folding back a straight line. In addition, widths of the plating stub conductors 145A-3 and 145B-2 may be different from each other. Further, the strip conductor 145A-2 of FIG. 12 may be connected to the via conductor 144A. In addition, a strip conductor opposed to the ground conductor 162 and having one end connected to the via conductor 144B and another end of an open end may be further formed on the surface of the interposer substrate 104F.

Eighth Embodiment

Figure 15:
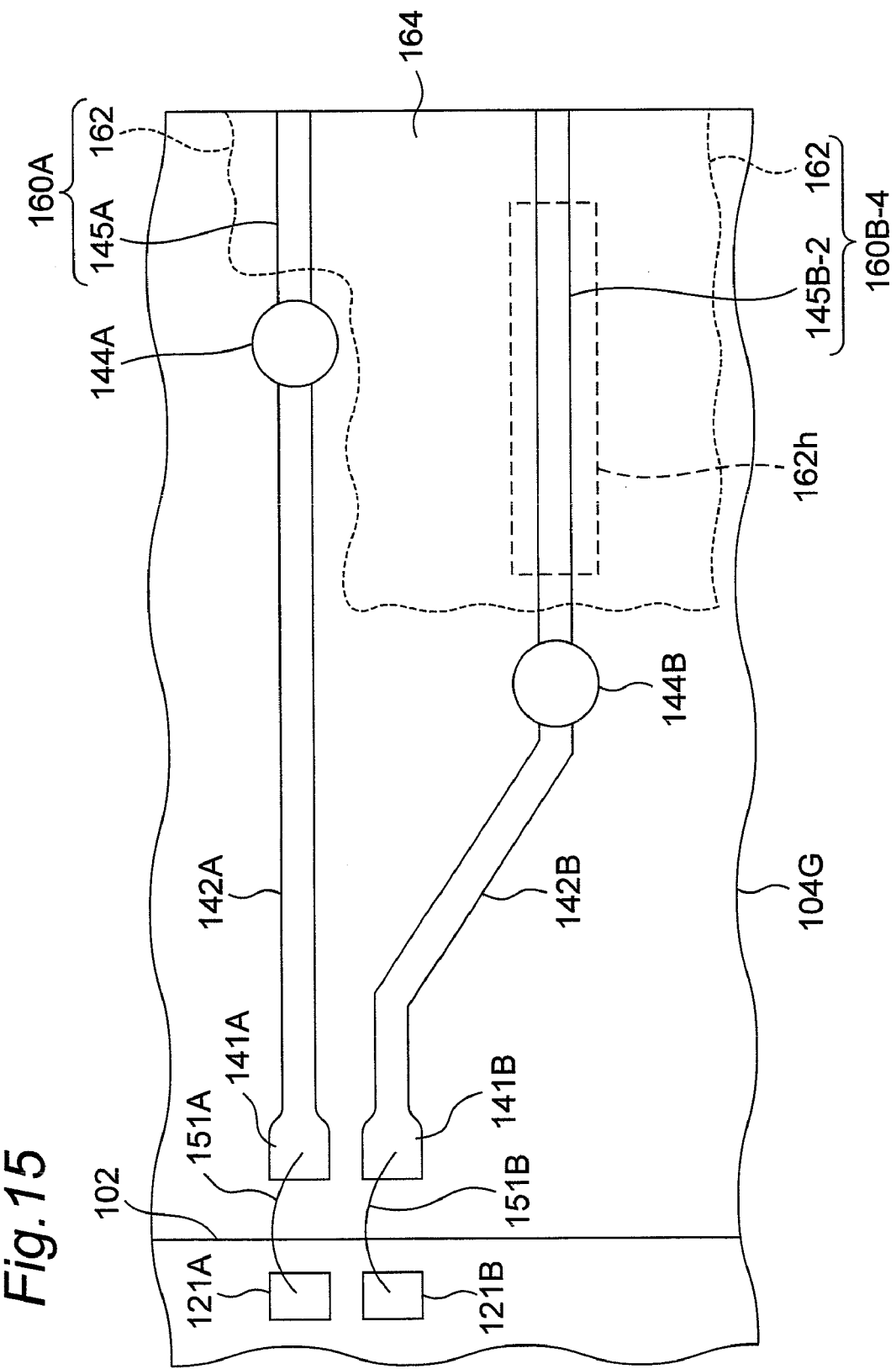
FIG. 15 is an enlarged view of an interposer substrate 104G according to an eighth embodiment of the present invention including the plating stub conductors 145A and 145B-2, and a ground conductor 162 having a notch 162h.

FIG. 15 is an enlarged view of an interposer substrate 104G according to an eighth embodiment of the present invention including the plating stub conductors 145A and 145B-2, and the ground conductor 162 having a notch 162h. As compared with the first embodiment the present embodiment is characterized in that the plating stub conductor 145B-2 according to the fourth embodiment is formed instead of the plating stub conductor 145B, and in that the notch 162h is provided with a part of a portion of the ground conductor 162. The above portion of the ground conductor 162 is opposed to the plating stub conductor 145B-2. Referring to FIG. 15, a portion of the ground conductor 162 is opposed to the plating stub conductor 145B-2, and the plating stub conductor 145B-2 and the above portion of the ground conductor 162 form a capacitor 160B-4 sandwiching the insulating layer 164. According to the present embodiment, by forming a larger notch 162h, it is possible to reduce a capacitance of the capacitor 160B-4, and this leads to a reduced delay amount of the signal transmitted via the connection wiring conductor 142A.

It is to be noted that the notch 162h may be formed in an entire portion of the ground conductor 162, the portion being opposed to the plating stub conductor 145B-2. In this case, the capacitor 160B-4 is not formed but only the capacitor 160A is formed. In addition, the shapes of the plating stub conductors 145A and 145B-2 are not limited to those shown in FIG. 15, but may be similar to those according to the above-mentioned first, second, fourth, fifth or seventh embodiment.

Ninth Embodiment

Figure 16:
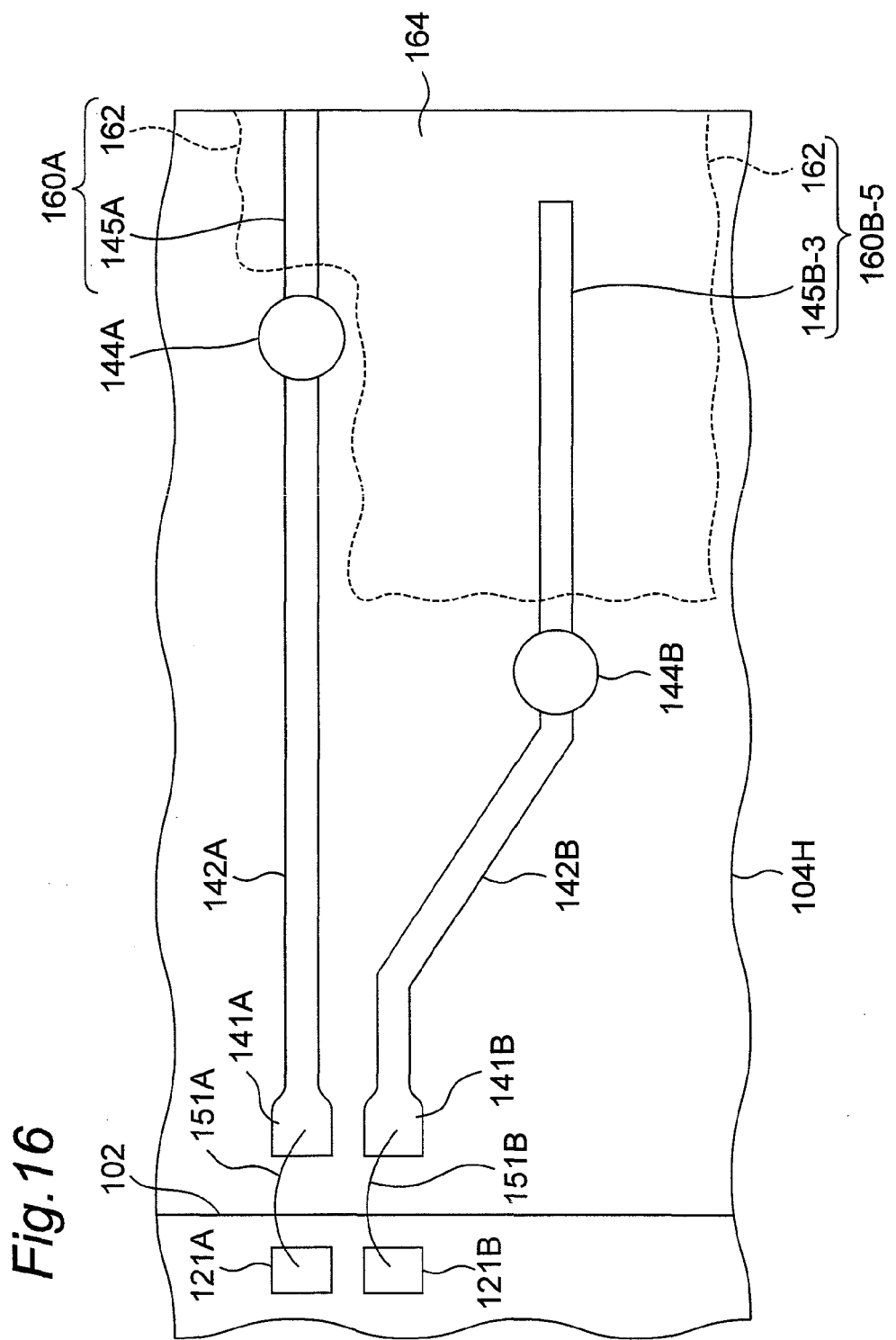
FIG. 16 is an enlarged view of an interposer substrate 104H according to a ninth embodiment of the present invention including plating stub conductors 145A and 145B-3.

FIG. 16 is an enlarged view of an interposer substrate 104H according to a ninth embodiment of the present invention including plating stub conductors 145A and 145B-3. As compared with the first embodiment, the present embodiment is characterized in that the plating stub conductor 145B-3 is formed instead of the plating stub conductor 145B. The plating stub conductor 145B-3 is formed by removing a part of the open end of the plating stub conductor 145B-2 (See FIG. 11) used when the noble metal plating treatment was performed. Referring to FIG. 16, the plating stub conductor 145B-3 and the ground conductor 162 are opposed to each other so as to sandwich the insulating layer 164 to form a capacitor 160B-5. By increasing the portion removed from the plating stub conductor 145B-2 used when the noble metal plating treatment was performed, it is possible to reduce a capacitance of the capacitor 160B-5, and this leads to a reduced delay amount of the signal transmitted via the connection wiring conductor 142A.

Tenth Embodiment

Figure 17:
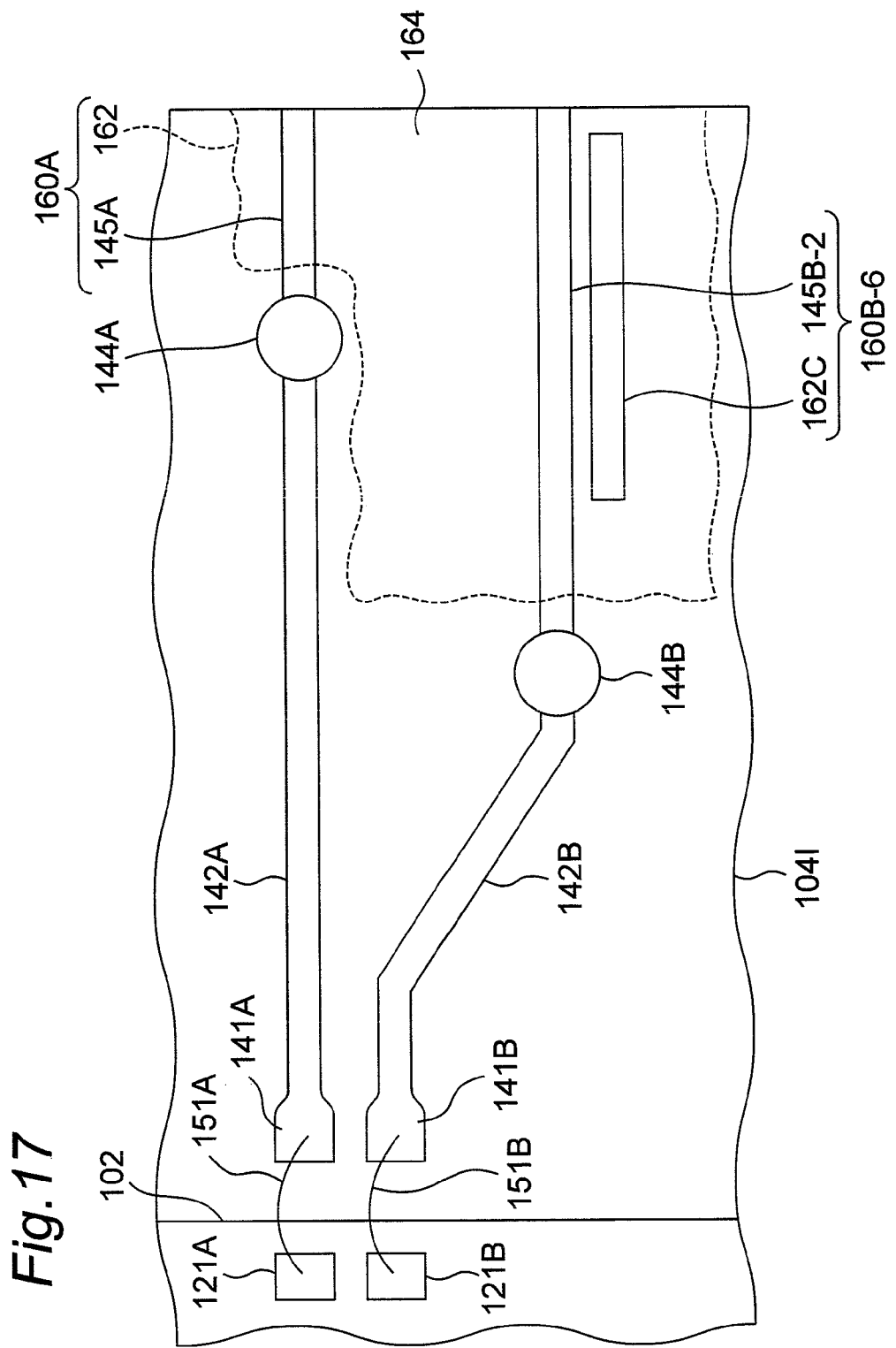
FIG. 17 is an enlarged view of an interpose board 104I according to a tenth embodiment of the present invention including the plating stub conductors 145A and 145B-2, and a ground conductor 162C.

FIG. 17 is an enlarged view of an interpose board 104I according to a tenth embodiment of the present invention including the plating stub conductors 145A and 145B-2, and a ground conductor 162C. As compared with the first embodiment, the present invention is characterized in that the plating stub conductor 145B-2 according to the fourth embodiment is formed instead of the plating stub conductor 145B, and in that the ground conductor 162C having a rectangular shape is formed near the plating stub conductor 145B-2 on a surface of the interposer substrate 104I. Referring to FIG. 17, the plating stub conductor 145B-2 and the ground conductor 162C are opposed to each other so as to form a capacitor 160B-6. By increasing a length of the ground conductor 162C, it is possible to increase a capacitance of the capacitor 160B-6, and this leads to an increased delay amount of the signal transmitted via the connection wiring conductor 142A.

Eleventh Embodiment

Figure 18:
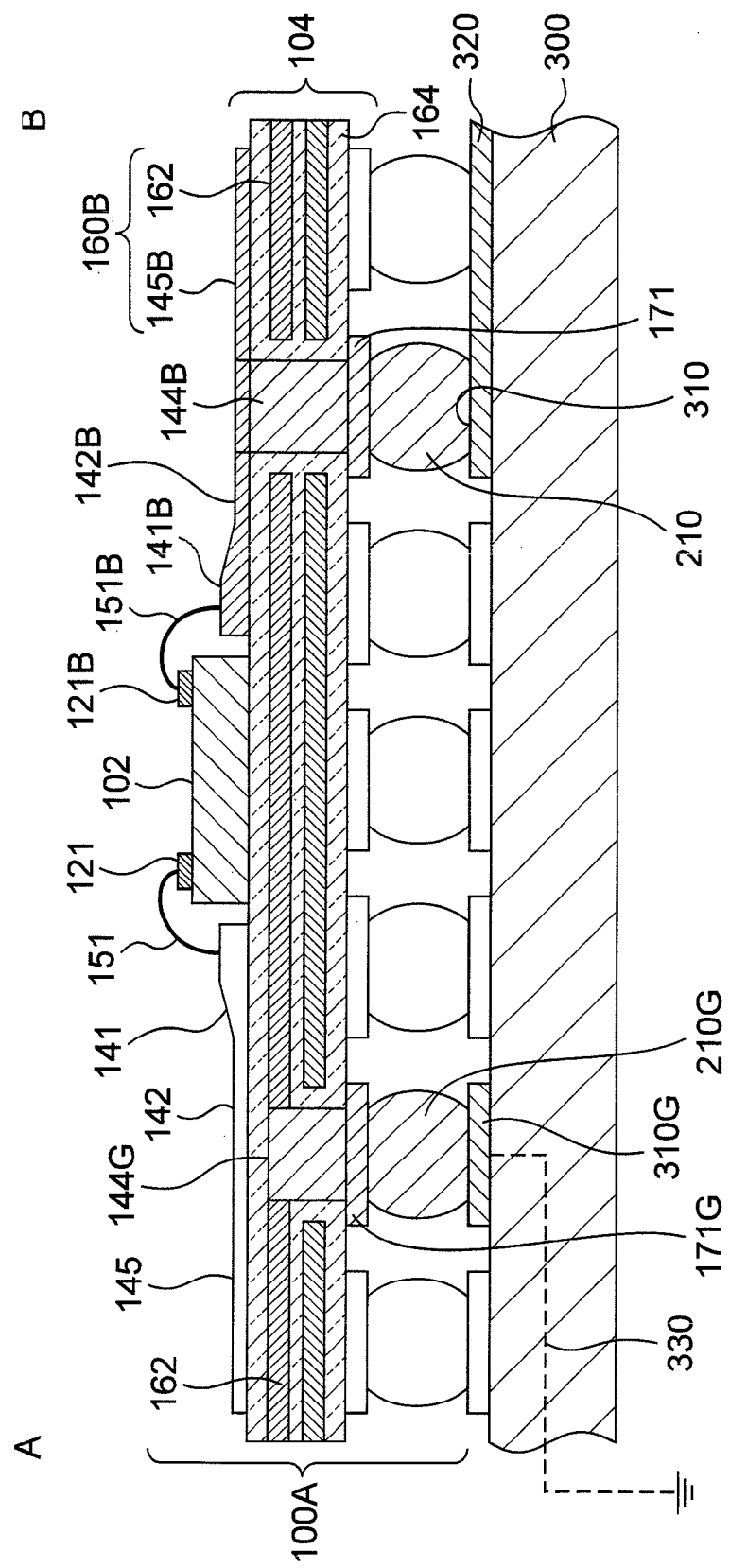
FIG. 18 is a cross-sectional view (which is taken along the line A-B of FIG. 2) of a semiconductor apparatus 100A according to an eleventh embodiment of the present invention.

FIG. 18 is a cross-sectional view (which is taken along the line A-B of FIG. 2) of a semiconductor apparatus 100A according to an eleventh embodiment of the present invention. As compared with the semiconductor apparatus 100 according to the first embodiment, the semiconductor apparatus 100A according to the present embodiment is characterized by further including the plurality of solder balls 210 formed on the back surface of the interposer substrate 104. The present embodiment exhibits advantageous effects similar to those of the first embodiment.

In each of the above-mentioned embodiments, the high-frequency digital signals are transmitted by the differential transmission or the single-ended transmission using the signal line including the connection wiring conductor 142A and the signal line including the connection wiring conductor 142B. However, the present invention is not limited to this. A plurality of three or more signals may be transmitted between a plurality of three or more terminals 121 of the semiconductor device 102 and a plurality of three or more electrode pads 310 formed on the mother board 300 via a plurality of three or more signal lines each including one connection wiring conductor 142, one via conductor 144, and one plating stub conductor 145. In this case, when the respective signals transmitted by the single ended transmission are related with each other and processed, phase shifts among the signals often cause noise. In such a case, the capacitances of the capacitors formed using the plating stub conductors 145 connected to the connection wiring conductors 142 may be adjusted so that phases of the signals have a predetermined relationship at one end of the signal lines (See FIG. 3) including the connection wiring conductors 142. Concretely speaking, the capacitance of the above capacitors may be adjusted so that the relationship among the phases of transmitting signals at one-ends of the signal lines is the same as the relationship among phases of received signals at another ends of the signal lines. Concretely speaking, the capacitances of the capacitors formed using the plating stub conductors 145 connected to the connection wiring conductors 142 using at least one of the capacitors 160A, 160A-1 to 160A-4, 160B, and 160B-1 to 160B-6 described in the above-mentioned first to tenth embodiments.

In each of the embodiments, after manufacturing each of the interposer substrates 140 and 140A to 140I, the capacitance of each of the capacitors 160A, 160A-1 to 160A-4, 160B, and 160B-1 to 160B-6 may be adjusted by removing a part of the corresponding plating stub conductor 145. For example, in the first embodiment, after implementing the semiconductor device 102 on the interposer substrate 104 and sealing the semiconductor device 102, a test for transmitting the pair of the differential signals to the semiconductor device 102 via the connection wiring conductors 142A and 142B of the interposer substrate 104 by the differential transmission is conducted. Then, the phase difference between the transmitted differential signals is measured, and the capacitance Ca of the capacitor 160A and the capacitance Cb of the capacitor 160B are determined so that the phase difference is substantially equal to 180 degrees. Based on the determined capacitances Ca and Cb, a part of the plating stub conductor 145A or 145B is removed.

INDUSTRIAL APPLICABILITY

As described above in detail, according to an interposer substrate of the present invention and a semiconductor apparatus including the interposer substrate, a plurality of signals are transmitted between a plurality of terminals of a semiconductor device and a plurality of electrode pads formed on a mother board via a plurality of signal lines formed on the interposer substrate. Each of the signal lines includes a connection wiring conductor formed on the surface of the interposer substrate, via conductor, and a strip conductor formed on the surface of the interposer substrate. The connection wiring conductor has one end electrically connected to one of the plurality of terminals of the semiconductor device, the via conductor has one end connected to another end of the connection wiring conductor and another end electrically connected to one of the plurality of electrode pads formed on the mother board, and the strip conductor has one end connected to one end of the via conductor and another end of an open end. The strip conductors and the ground conductor are formed so that at least one of the strip conductors and the ground conductor are opposed to each other so as to form at least one capacitor. A capacitance of the capacitor is adjusted so that phases of the signals transmitted via the respective signal lines have a predetermined relationship at one end of each of the signal lines. Therefore, it is possible to transmit high-frequency digital signals with accuracy higher than that of prior art.

REFERENCE SIGNS LIST 100 and 100A . . . Semiconductor apparatus,
102 . . . Semiconductor device,
104 and 104A to 104I . . . Interposer substrate,
121, 121A, 121B . . . Terminal,
141, 141A and 141B . . . Connection terminal,
142, 142A and 142B . . . Connection wiring conductor,
144, 144A, 144B and 144G . . . Via conductor,
145, 145A, 145A-1, 145A-3 and 145B-1 to 145B-3 . . . Plating stub conductor,
145A-2 . . . Strip conductor,
151, 151A and 151B . . . Wire,
160A, 160A-1 to 160A-4, 160B, 160B-1 to 160B-6 . . . . Capacitor,
162, 162A, 162B and 162C . . . Ground conductor,
162h . . . . Notch,
164 . . . Insulating layer,
171 and 171G . . . Electrode pad,
210 and 210G . . . Solder ball,
300 . . . Mother board,
310 and 310G . . . Electrode pad,
320 . . . Signal wiring, and
330 . . . Ground wiring.

The invention claimed is:

1. An interposer substrate for use in a semiconductor apparatus, the semiconductor apparatus comprising the interposer substrate provided between a semiconductor device and a mother board, the semiconductor device being implemented on a surface of the interposer substrate and having a plurality of terminals, the interposer substrate having a ground conductor, the mother board comprising a plurality of electrode pads,
wherein a plurality of signals are transmitted between the plurality of terminals of the semiconductor device and the plurality of electrode pads formed on the mother board via a plurality of signal lines formed on the interposer substrate,
wherein each of the signal lines comprises:
a connection wiring conductor formed on the surface of the interposer substrate, the connection wiring conductor having one end electrically connected to one of the plurality of terminals of the semiconductor device;
a via conductor having one end connected to another end of the connection wiring conductor and another end electrically connected to one of the plurality of electrode pads formed on the mother board; and
a strip conductor formed on the surface of the interposer substrate, the strip conductor having one end connected to one end of the via conductor and another end of an open end,
wherein the strip conductors and the ground conductor are formed so that at least one of the strip conductors and the ground conductor are opposed to each other so as to form at least one capacitor, and
wherein a capacitance of the capacitor is adjusted so that phases of the signals transmitted via the respective signal lines have a predetermined relationship at one end of each of the signal lines.

2. The interposer substrate as claimed in claim 1,
wherein at least one of the strip conductors has a meander shape.

3. The interposer substrate as claimed in claim 2,
wherein the meander shape is a folded shape obtained by folding back a straight line.

4. The interposer substrate as claimed in claim 1,
wherein a width of at least one of the strip conductors is larger than widths of the other strip conductors.

5. The interposer substrate as claimed claim 1,
wherein at least one of the signal lines further comprises at least one further strip conductor formed on the surface of the interposer substrate so as to be opposed to the ground conductor, the further strip conductor having one end connected to one end of one of the via conductors and another end of an open end.

6. The interposer substrate as claimed in claim 1,
wherein at least one of the strip conductors has a branched shape.

7. The interposer substrate as claimed in claim 1,
wherein the ground conductor is opposed to at least a part of each of the strip conductors so as to form the capacitor.

8. The interposer substrate as claimed in claim 1,
wherein the ground conductor is formed on the surface of the interposer substrate.

9. The interposer substrate as claimed in claim 1,
wherein the plurality of signal lines includes first and second signal lines for transmitting a pair of differential signals, and
wherein a capacitance of a first capacitor formed by a strip conductor of the first signal line and the ground conductor and a capacitance of a second capacitor formed by a strip conductor of the second signal line and the ground conductor are adjusted so that a phase difference between the pair of differential signals is substantially equal to 180 degrees at one of (a) a pair of terminals of the semiconductor device connected to the first and second signal lines and (b) a pair of electrode pads formed on the mother board connected to the first and second signal lines.

10. The interposer substrate as claimed in claim 9,
wherein a width of the strip conductor of the first signal line and a width of the strip conductor of the second signal line are different from each other.

11. The interposer substrate as claimed in claim 9,
wherein only the strip conductor of one of the first and second signal lines and the ground conductor form the capacitor.

12. The interposer substrate as claimed in claim 1,
wherein the plurality of signal lines includes third and fourth signal lines for transmitting a pair of transmitting signals, and
wherein a capacitance of a third capacitor formed by a strip conductor of the third signal line and the ground conductor and a capacitance of a fourth capacitor formed by a strip conductor of the fourth signal line and the ground conductor are adjusted so that a phase difference between the pair of transmitting signals is substantially equal to 0 degrees at one of (a) a pair of terminals of the semiconductor device connected to the third and fourth signal lines and (b) a pair of electrode pads formed on the mother board connected to the third and fourth signal lines.

13. The interposer substrate as claimed in claim 1,
wherein the connection wiring conductors and the strip conductors are formed on the surface of the interposer substrate by performing a plating treatment, respectively.

14. A semiconductor apparatus comprising:
a semiconductor device implemented on an interposer substrate and having a plurality of terminals; and
the interposer substrate provided between the semiconductor device and a mother board comprising a plurality of electrode pads, the interposer substrate having a ground conductor,
wherein a plurality of signals are transmitted between the plurality of terminals of the semiconductor device and the plurality of electrode pads formed on the mother board via a plurality of signal lines formed on the interposer substrate,
wherein each of the signal lines comprises:
a connection wiring conductor formed on the surface of the interposer substrate, the connection wiring conductor having one end electrically connected to one of the plurality of terminals of the semiconductor device;
a via conductor having one end connected to another end of the connection wiring conductor and another end electrically connected to one of the plurality of electrode pads formed on the mother board; and
a strip conductor formed on the surface of the interposer substrate, the strip conductor having one end connected to one end of the via conductor and another end of an open end,
wherein the strip conductors and the ground conductor are formed so that at least one of the strip conductors and the ground conductor are opposed to each other so as to form at least one capacitor, and
wherein a capacitance of the capacitor is adjusted so that phases of the signals transmitted via the respective signal lines have a predetermined relationship at one end of each of the signal lines.

15. The semiconductor apparatus as claimed in claim 14, further comprising a plurality of solder balls formed on a back surface of the interposer substrate, each of the plurality of solder balls being electrically connecting another end of each of the via conductors to each of electrode pads formed on the mother board.

\* \* \* \* \*